US012754488B2

(12) United States Patent
Swillam et al.

(10) Patent No.: US 12,754,488 B2
(45) Date of Patent: Oct. 6, 2026

(54) INTENSITY MEASUREMENTS USING OFF-AXIS ILLUMINATION

(71) Applicant: ASML Netherlands B.V., Veldhoven (NL)

(72) Inventors: Mohamed Swillam, Wilton, CT (US); Stephen Roux, New Fairfield, CT (US); Justin Lloyd Kreuzer, Trumbull, CT (US); Roxana Rezvani Naraghi, Easton, CT (US)

(73) Assignee: ASML NETHERLANDS B.V., Veldhoven (NL)

( * ) Notice: Subject to any disclaimer, the term of this patent is extended or adjusted under 35 U.S.C. 154(b) by 80 days.

(21) Appl. No.: 18/682,678

(22) PCT Filed: Jul. 21, 2022

(86) PCT No.: PCT/EP2022/070554
§ 371 (c)(1),
(2) Date: Feb. 9, 2024

(87) PCT Pub. No.: WO2023/016773
PCT Pub. Date: Feb. 16, 2023

(65) Prior Publication Data

US 2025/0130512 A1 Apr. 24, 2025

Related U.S. Application Data

(60) Provisional application No. 63/232,483, filed on Aug. 12, 2021.

(51) Int. Cl.
*G03F 9/00* (2006.01)
*G03F 7/00* (2006.01)

(52) U.S. Cl.
CPC ...... *G03F 9/7088* (2013.01); *G03F 7/706837* (2023.05); *G03F 7/706849* (2023.05);
(Continued)

(58) Field of Classification Search
CPC ......... G03F 7/706837; G03F 7/706849; G03F 7/706851; G03F 9/7088; G03F 9/7019; G03F 9/7065; G03F 9/7092; G03F 9/7096
See application file for complete search history.

(56) References Cited

U.S. PATENT DOCUMENTS 6,297,876 B1 10/2001 Bornebroek
6,952,253 B2 10/2005 Lof et al.
(Continued)

FOREIGN PATENT DOCUMENTS

EP 1 372 040 A2 12/2003
EP 3 839 635 A1 6/2021
(Continued)

OTHER PUBLICATIONS

International Search Report and Written Opinion of the International Searching Authority directed to International Patent Application No. PCT/EP2022/070554, mailed Dec. 5, 2022; 11 pages.
(Continued)

*Primary Examiner* — Kara E. Geisel
*Assistant Examiner* — Christina I Xing
(74) *Attorney, Agent, or Firm* — Pillsbury Winthrop Shaw Pittman, LLP

(57) ABSTRACT

Systems, apparatuses, and methods are provided for measuring intensity using off-axis illumination. An example method can include illuminating a region of a surface of a substrate with a first radiation beam at a first incident angle and, in response, measuring a first set of photons diffracted from the region. The example method can further include illuminating the region with a second radiation beam at a second incident angle and, in response, measuring a second set of photons diffracted from the region. The example method can further include generating measurement data for
(Continued)

the region based on the measured first set of photons and the measured second set of photons.

19 Claims, 19 Drawing Sheets

(52) U.S. Cl.
CPC ...... *G03F 7/706851* (2023.05); *G03F 9/7019* (2013.01); *G03F 9/7065* (2013.01)

(56) References Cited

U.S. PATENT DOCUMENTS

| | | | |
|---|---|---|---|
| 6,961,116 B2 | 11/2005 | Den Boef et al. | |
| 7,265,364 B2 | 9/2007 | Teunissen et al. | |
| 7,511,799 B2 | 3/2009 | Tel et al. | |
| 7,646,471 B2 | 1/2010 | Teunissen et al. | |
| 8,610,898 B2 | 12/2013 | Khuat Duy | |
| 8,842,293 B2 | 9/2014 | Den Boef et al. | |
| 10,241,425 B2 | 3/2019 | Reijnders | |
| 2011/0317163 A1* | 12/2011 | Lee | G03F 9/7046 356/401 |
| 2012/0057171 A1* | 3/2012 | Khuat Duy | G02B 27/40 356/494 |
| 2014/0183345 A1* | 7/2014 | Goodwin | G01D 5/34 250/231.1 |
| 2015/0176979 A1 | 6/2015 | Mathijssen et al. | |
| 2017/0184981 A1* | 6/2017 | Quintanilha | G03F 7/70633 |
| 2019/0243000 A1 | 8/2019 | Shim | |
| 2021/0095957 A1* | 4/2021 | Swillam | G03F 7/70616 |

FOREIGN PATENT DOCUMENTS

| | | |
|---|---|---|
| WO | WO 2020/043582 A1 | 3/2020 |
| WO | WO 2021/013483 A1 | 1/2021 |

OTHER PUBLICATIONS

International Preliminary Report on Patentability directed to International Patent Application No. PCT/EP2022/070554, issued Feb. 13, 2024.

* cited by examiner

500

700

INTENSITY MEASUREMENTS USING OFF-AXIS ILLUMINATION

CROSS-REFERENCE TO RELATED APPLICATIONS

This application claims priority of U.S. Provisional Patent Application No. 63/232,483, which was filed on Aug. 12, 2021, and which is incorporated herein in its entirety by reference.

TECHNICAL FIELD

The present disclosure relates to optical sensors and sensing systems for lithographic apparatuses.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Extreme ultraviolet (EUV) radiation, for example, electromagnetic radiation having wavelengths of around 50 nanometers (nm) or less (also sometimes referred to as soft x-rays), and including light at a wavelength of about 13.5 nm, can be used in or with a lithographic apparatus to produce extremely small features in or on substrates, for example, silicon wafers. A lithographic apparatus which uses EUV radiation having a wavelength within a range of 4 nm to 20 nm, for example 6.7 nm or 13.5 nm, can be used to form smaller features on a substrate than a lithographic apparatus which uses, for example, radiation with a wavelength of 193 nm.

Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

The present disclosure describes various aspects of systems, apparatuses, and methods for measuring and comparing the intensities of the different orders of diffracted radiation from a metrology system to determine and correct for level (e.g., height), alignment (e.g., based on alignment mark asymmetry), or both. For example, the disclosure provides techniques for using off-axis illumination to measure the intensity imbalance based on zero-order diffraction (or, additionally or alternatively, based on a portion of the first-order diffraction power) for use in determining level data and corrections based thereon. In another example, additionally or alternatively, the disclosure provides further techniques for using off-axis illumination to measure the intensity and/or phase imbalance based on positive and negative first-order diffraction for use in determining alignment data (e.g., asymmetry mark deformation data) and corrections based thereon. In various aspects, the term "off-axis" refers to a direction that is substantially nonparallel (e.g., angled, oblique) to the surface normal of the surface of the substrate under measurement (e.g., a direction that is substantially non-perpendicular to the surface of the substrate under measurement), while the term "on-axis" refers to a direction that is substantially parallel to the surface normal of the surface of the substrate under measurement (e.g., a direction that is substantially perpendicular to the surface of the substrate under measurement).

In some aspects, the present disclosure describes a metrology system. The metrology system can include a first illumination system configured to generate a first radiation beam at a first wavelength and transmit the first radiation beam toward a region of a surface of a substrate at a first incident angle. The metrology system can further include a second illumination system configured to generate a second radiation beam at a second wavelength and transmit the second radiation beam toward the region at a second incident angle. The metrology system can further include a first detection system configured to measure a first diffracted radiation beam at the first wavelength and diffracted from the region at a first diffraction angle in response to a first illumination of the region by the first radiation beam. The first detection system can be further configured to generate a first measurement signal based on the first diffracted radiation beam. The metrology system can further include a second detection system configured to measure a second diffracted radiation beam at the second wavelength and diffracted from the region at a second diffraction angle in response to a second illumination of the region by the second radiation beam. The second detection system can be further configured to generate a second measurement signal based on the second diffracted radiation beam. The metrology system can further include a controller configured to generate an electronic signal based on the first measurement signal and the second measurement signal.

In some aspects, the present disclosure describes an integrated optical device. The integrated optical device can include a first illumination system configured to generate a first radiation beam at a first wavelength and transmit the first radiation beam toward a region of a surface of a substrate at a first incident angle. The integrated optical device can further include a second illumination system configured to generate a second radiation beam at a second wavelength and transmit the second radiation beam toward the region at a second incident angle. The integrated optical device can further include a first detection system configured to measure a first diffracted radiation beam at the first wavelength and diffracted from the region at a first diffraction angle in response to a first illumination of the region by the first radiation beam. The first detection system can be further configured to generate a first measurement signal based on the first diffracted radiation beam. The integrated optical device can further include a second detection system configured to measure a second diffracted radiation beam at the second wavelength and diffracted from the region at a second diffraction angle in response to a second illumination of the region by the second radiation beam. The second detection system can be further configured to generate a second measurement signal based on the second diffracted radiation beam. The integrated optical device can further include a controller configured to generate an electronic signal based on the first measurement signal and the second measurement signal.

In some aspects, the present disclosure describes a method for measuring intensity using off-axis illumination. The method can include illuminating, by a first illumination system, a region of a surface of a substrate with a first radiation beam at a first incident angle. The method can further include illuminating, by a second illumination system, the region with a second radiation beam at a second incident angle. The method can further include measuring, by a first detection system, a first set of photons diffracted from the region in response to the illuminating the region with the first radiation beam. The method can further include measuring, by a second detection system, a second set of photons diffracted from the region in response to a second illumination of the region with the second radiation beam. The method can further include generating, by a controller, an electronic signal based on the measured first set of photons and the measured second set of photons.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
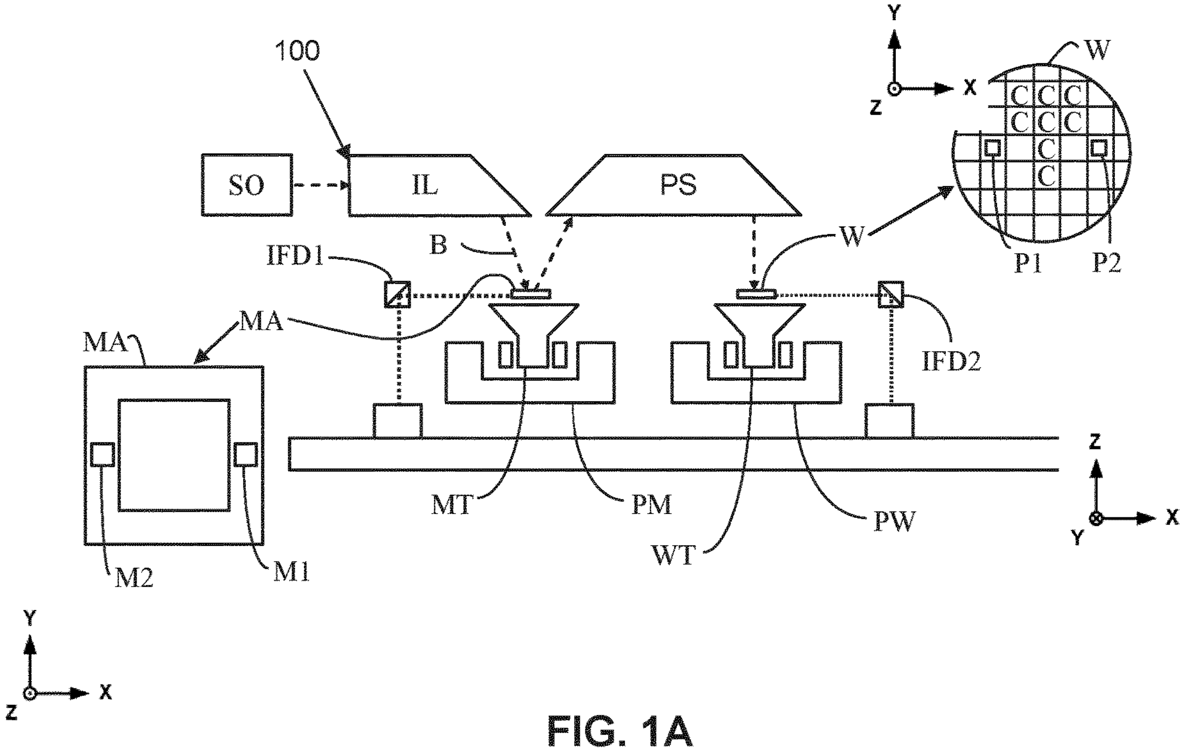
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Overview

On Product Overlay (OPO) is a measure of a lithographic apparatus's ability to fabricate IC layers accurately on top of each other. Successive layers or multiple processes on the same layer must be accurately aligned to the previous layer. Otherwise, electrical contact between structures can be poor and the resulting devices may not perform to specification. Accurate alignment resulting from decreased OPO errors can improve device yield and enable smaller product patterns to be fabricated. The overlay error between successive layers formed in or on the patterned substrate can be controlled by various parts of the exposure system of the lithographic apparatus.

Process-induced wafer errors can be a main contributor to OPO errors, which can be attributed to the complexity of the patterns as well as the quantity of patterned layers. OPO errors can have relatively high spatial variations, which can vary from wafer to wafer as well as within each wafer. Measurement of the relative position of several alignment marks within a field can reduce and help correct OPO errors. Alignment error variations within the field can be used, for example, in a regression model to correct OPO errors within the field.

In order to control a lithographic process to place device features accurately on the substrate, one or more diffraction targets (e.g., alignment marks) can be provided on the substrate, and the lithographic apparatus can include one or more level sensors and alignment sensors (e.g., forming a position measuring apparatus) configured to measure the three-dimensional positions of the one or more diffraction targets. Additionally, a fringe pattern can be formed by two off-axis coherent beams of an alignment sensor to provide structured illumination, which can act as a projected reference grating to investigate diffraction target asymmetry and substantially eliminate the need for a separate physical reference grating. Process-induced wafer errors can be further mitigated by measuring the relative positions of several alignment marks within a particular measurement field. For example, alignment error variation within the field can be used to fit a model to correct for OPO within the field.

In one example, a lithographic apparatus can include one or more alignment systems configured to measure the position of the diffraction target and align the substrate with respect to the lithographic apparatus. For example, the data can be obtained with a SMart Alignment Sensor Hybrid (SMASH) sensor that employs a self-referencing interferometer with a single detector and four different wavelengths, and extracts the alignment signal in software. An example SMASH sensor is described in, for example, U.S. Pat. No. 6,961,116, issued Nov. 1, 2005, and titled "LITHOGRAPHIC APPARATUS, DEVICE MANUFACTURING METHOD, AND DEVICE MANUFACTURED THEREBY," which is hereby incorporated by reference in its entirety. In another example, the data can be obtained with an Advanced Technology using High order ENhancement of Alignment (ATHENA) sensor that directs each of seven diffraction orders to a dedicated detector. An example ATHENA sensor is described in, for example, U.S. Pat. No. 6,297,876, issued Oct. 2, 2001, and titled "LITHOGRAPHIC PROJECTION APPARATUS WITH AN ALIGNMENT SYSTEM FOR ALIGNING SUBSTRATE ON MASK," which is hereby incorporated by reference in its entirety.

In yet another example, an alignment system can include a self-referencing interferometer configured to produce two overlapping images of an alignment marker, rotate these two overlapping images over 180° with respect to each other, and detect the intensity variation of the interfering Fourier transforms of these two overlapping images in a pupil plane. These intensity variations can correspond to a phase difference between different diffraction orders of the two overlapping images. The self-referencing interferometer can derive phase difference positional information from this phase difference for use in the alignment process. Example alignment systems that include self-referencing interferometers are described in, for example, European Patent No. EP 1 372 040, granted Mar. 5, 2008, and titled "LITHOGRAPHIC APPARATUS AND DEVICE MANUFACTURING METHOD," and U.S. Pat. No. 8,610,898, issued Dec. 17, 2013, and titled "SELF-REFERENCING INTERFEROMETER, ALIGNMENT SYSTEM, AND LITHOGRAPHIC APPARATUS," each of which is hereby incorporated by reference in its entirety.

Additionally, measurement of a plurality of alignment marks can enable modeling and correction of intra-field distortion. For example, wafer alignment systems can be implemented to enable correction of intra-field distortion without substantially impacting overall throughput. These wafer alignment systems can utilize interferometry and multi-mode interference (MMI) to measure the position of the diffraction target and align the substrate with respect to the lithographic apparatus. Example wafer alignment systems are described in, for example, U.S. Provisional Patent Application No. 62/724,198, filed Aug. 29, 2018, and titled "COMPACT ALIGNMENT SENSOR ARRANGEMENTS," U.S. Provisional Patent Application No. 62/877,964, filed Jul. 24, 2019, and titled "ON CHIP WAFER ALIGNMENT SENSOR," and U.S. Provisional Patent Application No. 63/043,543, filed Jun. 24, 2020, and titled "SELF-REFERENCING INTEGRATED ALIGNMENT SENSOR," each of which is hereby incorporated by reference in its entirety.

In still another example, a lithographic apparatus such as a scanner can include a level sensor to measure the height of a wafer surface before exposure. The lithographic apparatus can use this measurement: (i) to calculate the expose profiles followed by the wafer stage during the exposure (and, in some aspects, lens characteristics); and (ii) for diagnostics on leveling and focus errors made during exposure. The level sensor can control the wafer stage while trying to keep the wafer in focus while measuring the wafer map. The level sensor capture is the initial measurement to find the surface of the wafer.

However, these and other alignment and level sensing systems and techniques can be subject to certain drawbacks and limitations. For example, some of these alignment systems and techniques can be substantially incapable of measuring distortions within the alignment mark field (e.g., intra-field distortion). In another example, some of these alignment systems and techniques can be substantially incapable of measuring finer alignment grating pitches, such as grating pitches less than about 1.0 micron. In yet another example, some of these alignment systems and techniques can have a limited capability of measuring multiple diffraction targets substantially simultaneously. In still another example, some of these alignment systems and techniques can be relatively bulky and complex based on, for example, the requirement for two-dimensional (2D) control of multiple illuminators. Further, some of these alignment systems and techniques can measure only one position of one alignment mark at a time and thus trying to measure the position of many marks using current alignment sensor technology would result in significant time and throughput penalties. Further still, although some of these alignment systems and techniques can utilize waveguide gratings, their wavelength dependence can cause elevation shifts at different wavelengths. Additionally, intensity and intensity imbalance measurements can require a power splitter and two complete detection systems, including an optical analog to digital board (OADB) and a demultiplexer (demux), and the output can also depend on the wafer quality and thereby reduce the current intensity of the signal going to the self-referencing interferometer (SRI).

Accordingly, there is a need for a level sensing and alignment system capable of nanometer-scale precision alignment to diffraction target fabricated on a substrate. There is a further need for a scalable, compact (e.g., reduced footprint) level sensing and alignment system that is capable of measuring intra-field distortion and configured to support finer diffraction target pitches and measure a greater number of diffraction targets substantially simultaneously. Additionally, there is a need for a level sensing and alignment system that includes a wideband interferometer and a wideband optical coupler that can cover substantially the whole spectrum in a vertical range (e.g., distance along the Z-axis) of about 400 nm to about 100 nm from the surface of the substrate.

In contrast, some aspects of the present disclosure can provide systems, apparatuses, methods, and computer program products for determining a position of a substrate with greater precision. As used herein, the term "position" can refer to three-dimensional position and include level (e.g., height, in the Z-direction) and alignment (e.g., in the XY-plane), including corrections thereto (e.g., based on alignment mark asymmetry data). In some aspects, this can be performed by measuring the intensity and the intensity imbalance of the diffracted order from the alignment sensor for use in determining alignment mark deformation and correcting for it. In some aspects, the present disclosure describes metrology systems that include various combinations of the components, structures, features, and techniques described with reference to the systems, apparatuses, methods, and computer program products disclosed herein. In some aspects, the present disclosure describes metrology systems that utilize off-axis illumination to determine both the level and alignment of a region of a surface of a substrate (e.g., including an alignment grating structure having a plurality of alignment marks).

There are many exemplary aspects to the systems, apparatuses, methods, and computer program products disclosed herein. For example, aspects of the present disclosure can provide for improved accuracy, cost reduction, and scalability because, in some aspects, hundreds of sensors can be implemented on the same common platform. In another example, the integration of components (e.g., illumination sources, optical couplers, fibers, mirrors, lenses, prisms, beam splitters, wave plates, waveguides, polarizers, polarization rotators, detectors, processors, and other suitable structures) disclosed herein can provide a miniaturized single-chip sensor for measuring characteristics, such as levels and alignment positions, of alignment marks positioned on a substrate. In still another example, aspects of the present disclosure can provide for multiple sensors (e.g., sensor array) disposed on a single on-chip integrated alignment system that can conduct different measurements (e.g., level, alignment, and other measurements) of multiple alignment marks positioned on the same substrate simultaneously or in real-time.

In still another example, aspects of the present disclosure can provide for substantially increased stability and phase accuracy, as well as decreased optical coupling losses, for precise and consistent wafer alignment. In still another example, aspects of the present disclosure can provide for nanometer-scale precision alignment to an alignment grating mark printed on the wafer. In still another example, aspects of the present disclosure can provide for a compact alignment sensor capable of measuring intra-field distortion that can support finer alignment grating pitches and measure multiple marks simultaneously. In still another example, aspects of the present disclosure can provide for self-aligned and compact sensor systems having reduced footprints and higher accuracy measurements of intra-field distortion. In still another example, aspects of the present disclosure can provide a compatible level sensor for an integrated sensor for alignment and metrology to provide a complete solution for our metrology sensing systems.

In still other examples, aspects of the present disclosure provide for a metrology system that can: (i) work well as an interferometer over small wavelength bands; (ii) be substantially more compact in size (e.g., the total system can be about 5 millimeters (mm) by about 5 mm in size, which provides for better accuracy and multiple parallel alignment sensing), allowing for better accuracy and fitting well with the needed specification for multiple parallel alignment sensing; (iii) be scalable, as the system can have hundreds of sensors disposed on the same sensing chip; (iv) be cost effective (e.g., the total cost of the system is substantially less than other systems); (v) reduce the cost and hardware complexity by involving a less expensive, integrated system that is based on structured illumination; (vi) enable parallelization as a result of its decrease in size; (vii) provide for illumination spot shaping and control by controlling the phase and magnitude of each illumination source in the array of illumination sources; (viii) provide for beam steering capabilities (e.g., to enable matching different mark sizes); and (ix) provide a complete integrated alignment sensor for measuring level, alignment, and additional metrological measurements.

Before describing such aspects in more detail, however, it is instructive to present an example environment in which aspects of the present disclosure can be implemented.

Example Lithographic Systems

Figure 1B:
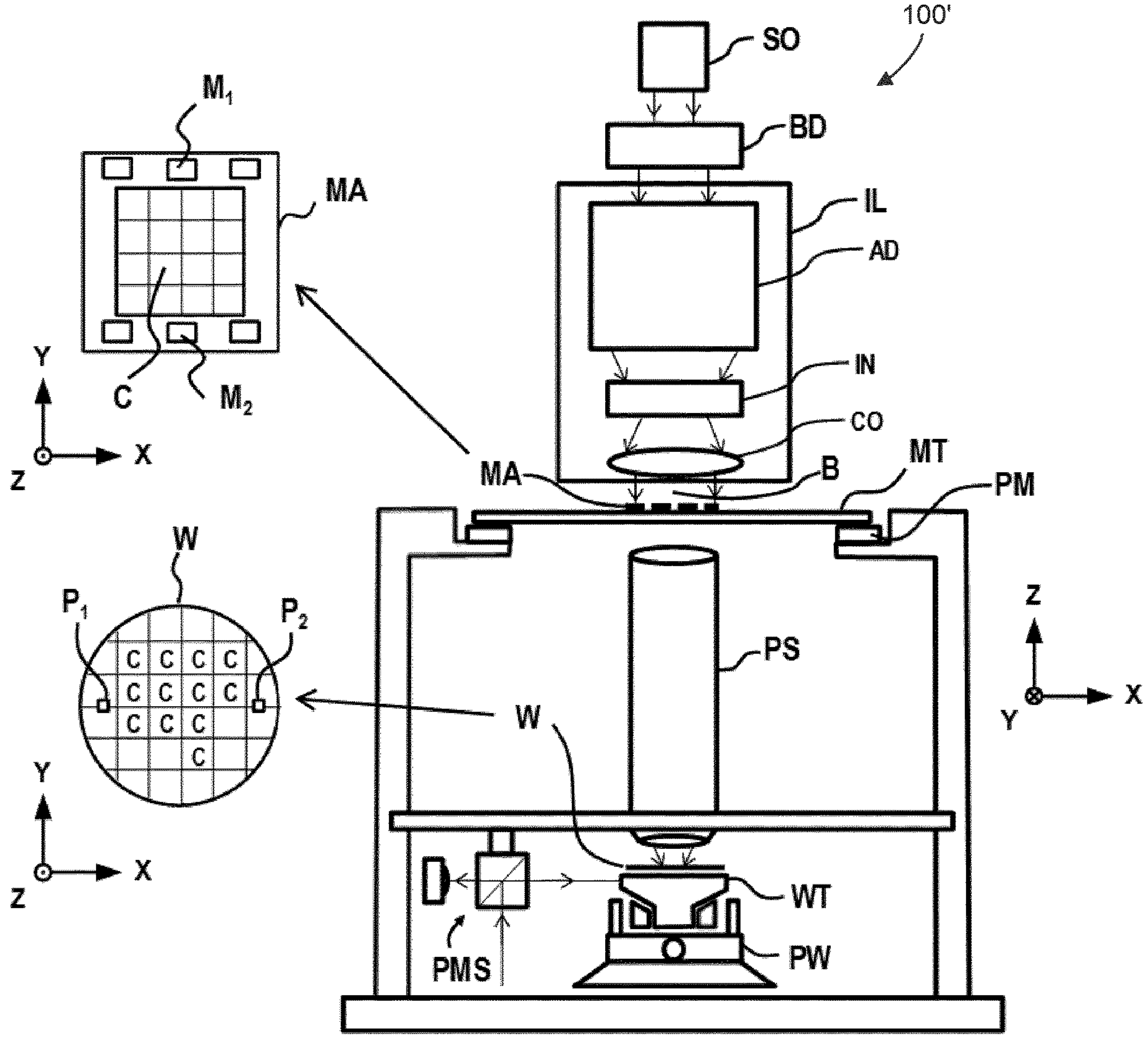
FIG. 1B is a schematic illustration of an example transmissive lithographic apparatus according to some aspects of the present disclosure.

FIGS. 1A and 1B are schematic illustrations of a lithographic apparatus 100 and a lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view) that are normal to the XY plane (e.g., the X-axis points to the right, the Y-axis points upward, and the Z-axis points out of the page toward the viewer).

In some aspects, the lithographic apparatus 100 and/or the lithographic apparatus 100' can include one or more of the following structures: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS (e.g., a refractive projection lens system) configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

In some aspects, in operation, the illumination system IL can receive a radiation beam from a radiation source SO (e.g., via a beam delivery system BD shown in FIG. 1B). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100' of FIG. 1B) or reflective (as in lithographic apparatus 100 of FIG. 1A). The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 and/or the lithographic apparatus 100' can be of a type having two (e.g., "dual stage") or more substrate tables WT and/or two or more mask tables). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W located on another of the substrate tables WT is being used for exposing a pattern on another substrate W. In some aspects, the additional table may not be a substrate table WT.

In some aspects, in addition to the substrate table WT, the lithographic apparatus 100 and/or the lithographic apparatus 100' can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 and/or the lithographic apparatus 100' can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS. Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952,253, issued Oct. 4, 2005, and titled "LITHOGRAPHIC APPARATUS AND DEVICE MANUFACTURING METHOD," which is incorporated by reference herein in its entirety.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

Referring to FIG. 1A, in operation, the radiation beam B can be incident on the patterning device MA (e.g., a mask, reticle, programmable mirror array, programmable LCD panel, any other suitable structure or combination thereof), which can be held on the support structure MT (e.g., a mask table), and can be patterned by the pattern (e.g., design layout) present on the patterning device MA. In lithographic apparatus 100, the radiation beam B can be reflected from the patterning device MA. Having traversed (e.g., after being reflected from) the patterning device MA, the radiation beam B can pass through the projection system PS, which can focus the radiation beam B onto a target portion C of the substrate W or onto a sensor arranged at a stage.

In some aspects, with the aid of the second positioner PW and position sensor IFD2 (e.g., an interferometric device, linear encoder, or capacitive sensor), the substrate table WT can be moved accurately, e.g., so as to position different target portions C in the path of the radiation beam B. Similarly, the first positioner PM and another position sensor IFD1 (e.g., an interferometric device, linear encoder, or capacitive sensor) can be used to accurately position the patterning device MA with respect to the path of the radiation beam B.

In some aspects, patterning device MA and substrate W can be aligned using mask alignment marks M1 and M2 and substrate alignment marks P1 and P2. Although FIGS. 1A and 1B illustrate the substrate alignment marks P1 and P2 as occupying dedicated target portions, the substrate alignment marks P1 and P2 may be located in spaces between target portions. Substrate alignment marks P1 and P2 are known as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zero-order diffraction generates diverted diffracted beams with a change of direction in a direction perpendicular to the lines. Reflected light (e.g., zero-order diffracted beams) traverses the pattern without any change in propagation direction. The zero-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zero-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zero-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zero-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zero-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position. Similarly, the first positioner PM and another position sensor (e.g., an interferometric device, linear encoder, or capacitive sensor) (not shown in FIG. 1B) can be used to accurately position the patterning device MA with respect to the path of the radiation beam B (e.g., after mechanical retrieval from a mask library or during a scan). Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some instances, both the in-vacuum and out-of-vacuum robots need to be calibrated for a smooth transfer of any payload (e.g., a mask) to a fixed kinematic mount of a transfer station.

In some aspects, the lithographic apparatuses 100 and 100' can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.
2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.
3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatuses 100 and 100' can employ combinations and/or variations of the above-described modes of use or entirely different modes of use.

In some aspects, as shown in FIG. 1A, the lithographic apparatus 100 can include an EUV source configured to generate an EUV radiation beam B for EUV lithography. In general, the EUV source can be configured in a radiation source SO, and a corresponding illumination system IL can be configured to condition the EUV radiation beam B of the EUV source.

Figure 2:
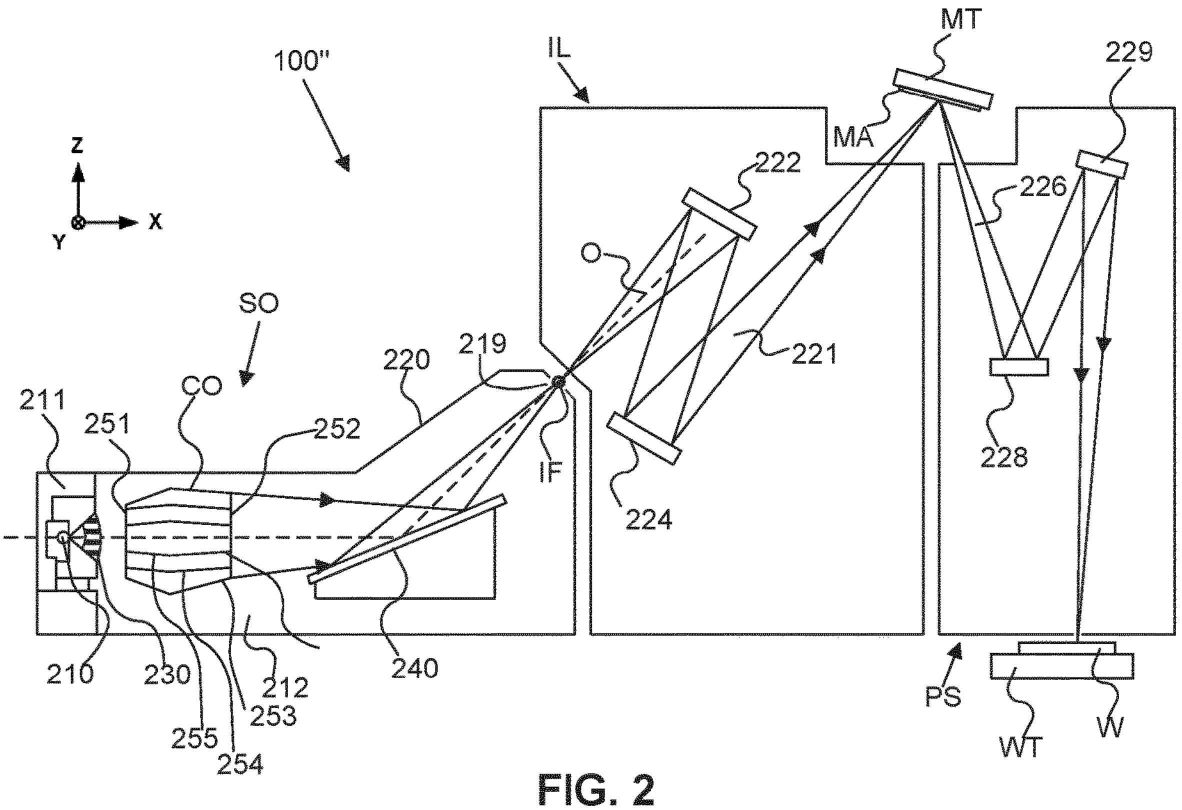
FIG. 2 is a more detailed schematic illustration of the reflective lithographic apparatus shown in FIG. 1A according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in the source chamber 211. The contaminant trap 230 can include a channel structure. Contaminant trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF.

The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. The grating spectral filter 240 can be used to suppress infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
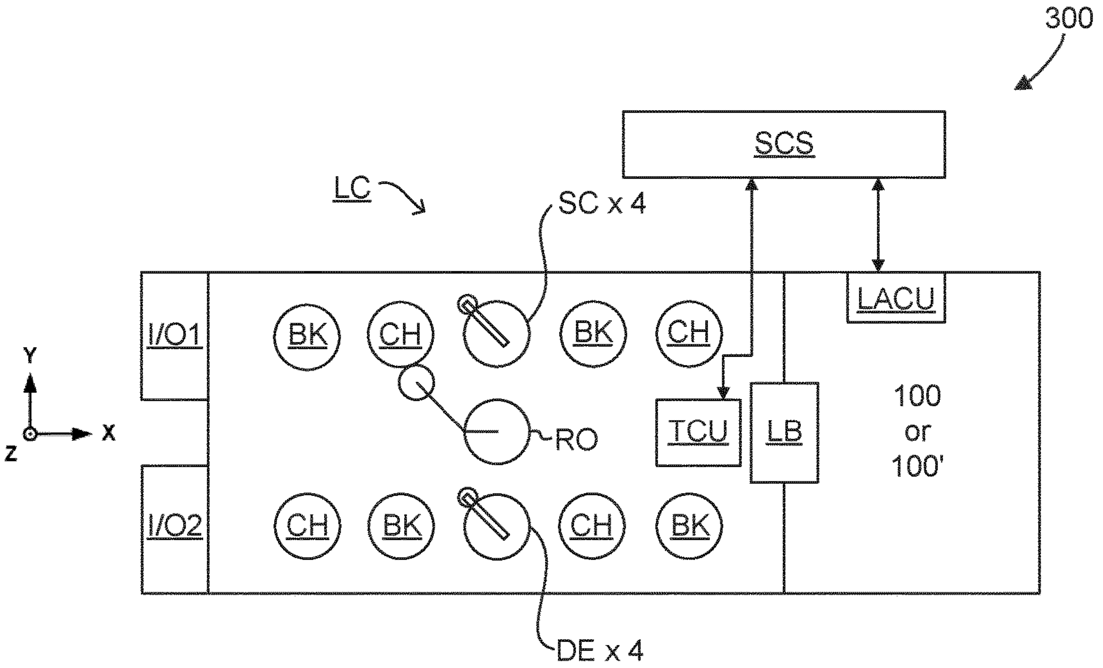
FIG. 3 is a schematic illustration of an example lithographic cell according to some aspects of the present disclosure.

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Metrology Systems

Example metrology systems for measuring intensity using off-axis illumination are described below with reference to FIGS. 4-10. In various aspects, the example metrology systems described with reference to FIGS. 4-10 can be implemented as alignment sensors, asymmetry sensors, level sensors, and combinations thereof, and can be used to determine alignment data, asymmetry data, level data, and combinations thereof.

Figure 4A:
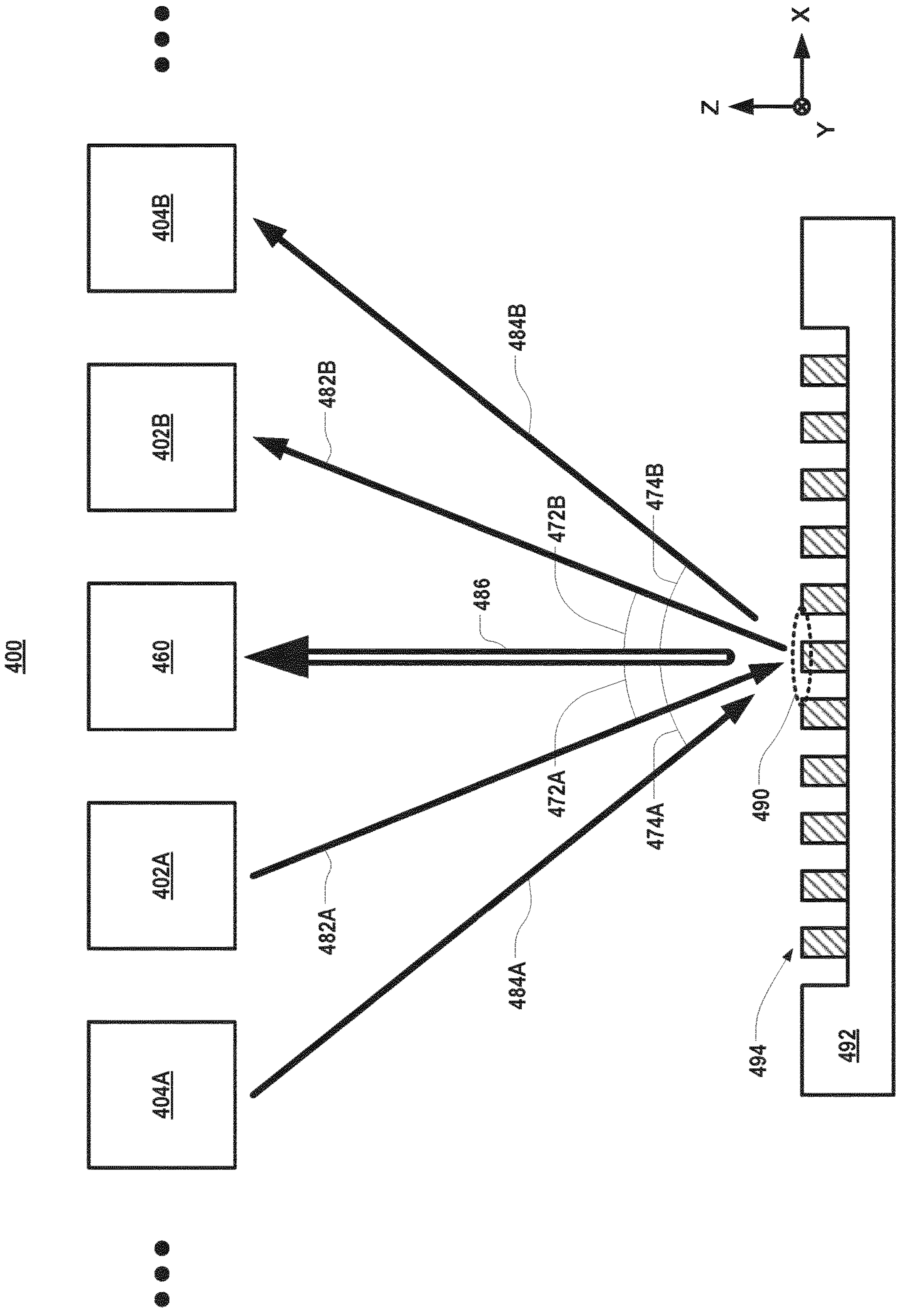
FIGS. 4A and 4B are schematic illustrations of an example metrology system according to some aspects of the present disclosure.
Figure 4B:
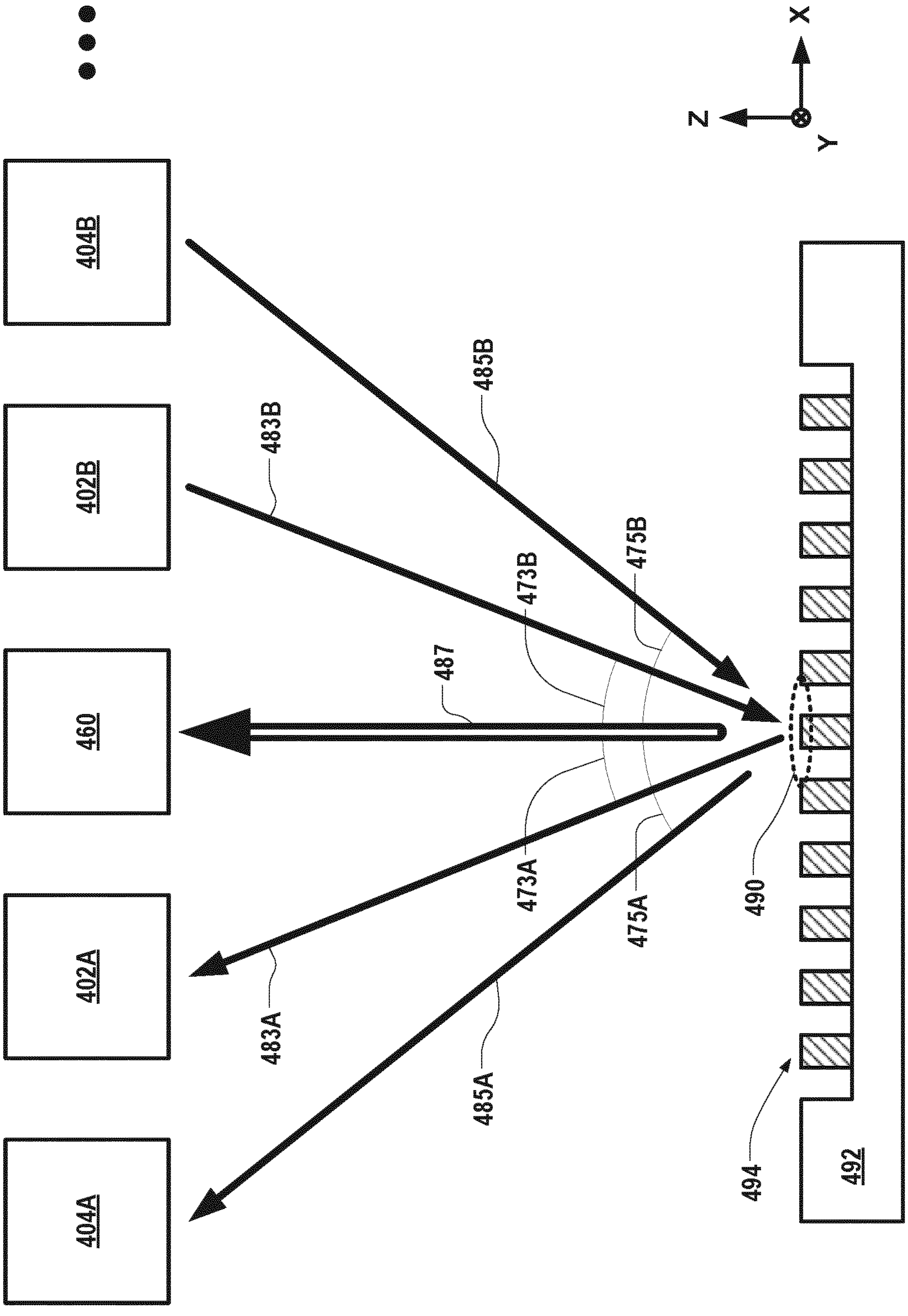

FIGS. 4A and 4B are schematic illustrations of an example metrology system 400 utilizing off-axis illumination for performing intensity and phase measurements according to some aspects of the present disclosure. In some aspects, the example metrology system 400, or any portion thereof, can be implemented using any of the structures, components, features, or techniques described with reference to the example metrology system 500 described with reference to FIG. 5; the example metrology system 600 described with reference to FIGS. 6A, 6B, 6C, 6D, 6E, 6F, and 6G; the example metrology system 700 described with reference to FIG. 7; the example metrology system 800 described with reference to FIG. 8; the example metrology system 900 described with reference to FIG. 9; the example metrology system 1000 described with reference to FIG. 10; the example computing system 1200 described with reference to FIG. 12; any other suitable structure, component, feature, or technique; any portion thereof; or any combination thereof.

In some aspects, the example metrology system 400 can include a plurality of off-axis illumination subsystems (e.g., radiation sources). In some aspects, the plurality of off-axis illumination subsystems can include a first off-axis illumination subsystem 402A, a second off-axis illumination subsystem 402B, a third off-axis illumination subsystem 404A, a fourth off-axis illumination subsystem 404B, any other suitable off-axis illumination subsystem (e.g., tens or hundreds of off-axis illumination subsystems), or any combination thereof. In some aspects, the example metrology system 400 can further include an on-axis detection subsystem 460. In some aspects, the example metrology system 400 can include an integrated optical device that includes the plurality of off-axis illumination subsystems and the on-axis detection subsystem 460. In some aspects, the example metrology system 400, the plurality of off-axis illumination subsystems, the on-axis detection subsystem 460, or a combination thereof can include, or be in communication with, a metrology controller (e.g., example computing system 1200 shown in FIG. 12) configured to perform the functions and operations described herein.

In some aspects, each of the plurality of off-axis illumination subsystems can be configured to emit an off-axis radiation beam (e.g., a beam of substantially coherent radiation) towards a region 490 of a surface of a substrate 492 at a different off-axis incident angle (e.g., related to the wavelength of the off-axis radiation beam and the grating period in the region 490). In some aspects, an area of the region 490 can be about 1.0 square millimeter. In one illustrative and non-limiting example, a diameter of the region 490 can be about 35 microns. In some aspects, the region 490 can include a portion of an alignment grating structure 494. In some aspects, each of the plurality of off-axis illumination subsystems can include an optical coupler (e.g., a wideband, wavelength-insensitive in-and-out optical coupler) and can function as both an off-axis illumination subsystem and an off-axis detection subsystem (e.g., also referred to herein as an "emitter-detector"). In some aspects, each of the plurality of off-axis illumination subsystems can be included in, or function as, a one-dimensional (1D) or two-dimensional (2D) array for beam steering, focusing, and controlling of the illumination spot incident on the region 490. In some aspects, the plurality of off-axis illumination subsystems can be disposed on a single-chip, silicon nitride ($Si_3N_4$)-based alignment system. For example, the single-chip, silicon nitride-based alignment system can include a substrate (e.g., a Si substrate), an insulation layer (e.g., a silicon dioxide ($SiO_2$) insulation layer), a plurality of silicon nitride gratings, and a plurality of phase shifters respectively disposed on the plurality of silicon nitride gratings (e.g., one phase shifter per grating).

In some aspects, each of the plurality of off-axis illumination subsystems can include a phase array configured to steer an off-axis radiation beam toward the region 490. In some aspects, each phase array can include a plurality of phase shifters (e.g., delay lines, thermo-optic phase shifters, or any other suitable phase shifters). In some aspects, each phase array can include a plurality of variable phase modulators, such as a plurality of optical phase modulators (OPMs). In some aspects, each of the plurality of off-axis illumination subsystems can include, or be in optical communication with, one or more optical couplers, illumination sources, fibers, mirrors, beam splitters, metasurfaces (e.g., for beam steering to compensate for alignment mark size change by changing the angle of the emerging beam), prisms, lenses, waveguides, detectors, processors, other suitable structures, and combinations thereof.

In some aspects, the example metrology system 400 can include an optical coupler that is configured to be optically coupled to each of the plurality of off-axis illumination subsystems and a source illumination subsystem. In some aspects, the optical coupler can include, for example, a wideband, on-chip optical coupler; a lensed-top, vertically-curved coupler; direct laser writing for a lensed vertical coupler; a wideband, wavelength-insensitive in-and-out coupler; or any other suitable optical coupler. In some aspects, the optical coupler can be configured to receive multi-wavelength radiation (e.g., white light, incoherent radiation, dual-wavelength radiation, tri-wavelength radiation, quad-wavelength radiation, and so forth) from the source illumination subsystem, filter the received multi-wavelength radiation into a plurality of coherent radiation beams each at a different wavelength, and transmit each of the plurality of coherent off-axis radiation beams to a respective one of the plurality of off-axis illumination subsystems. In some aspects, the source illumination subsystem can include a light source such as an optical fiber or light pipe coupled to a light-emitting diode (LED) light source. In some aspects, the source illumination subsystem can include an integrated laser diode such as a vertical-cavity surface-emitting laser (VCSEL).

In one illustrative example, the optical coupler can be configured to receive a white light beam from the source illumination subsystem, filter the white light beam into a blue light beam and a green light beam, transmit (e.g., using a first optical splitter) the blue light beam to the first off-axis illumination subsystem 402A and the second off-axis illumination subsystem 402B, and transmit (e.g., using a second optical splitter) the green light beam to the third off-axis illumination subsystem 404A and the fourth off-axis illumination subsystem 404B. In some aspects, the example metrology system 400 can include a polarization rotator disposed along the optical path between the optical coupler and one or more of the plurality of off-axis illumination subsystems. For example, to continue the illustrative example above, the example metrology system 400 can include: a first polarization rotator disposed between the optical coupler and the second off-axis illumination subsystem 402B (e.g., such that the blue light beam received by the second off-axis illumination subsystem 402B differs in rotation (e.g., by 90 degrees) from the blue light beam received by the first off-axis illumination subsystem 402A); and a second polarization rotator disposed between the optical coupler and the fourth off-axis illumination subsystem 404B (e.g., such that the green light beam received by the fourth off-axis illumination subsystem 404B differs in rotation (e.g., by 90 degrees) from the green light beam received by the third off-axis illumination subsystem 404A).

In some aspects, the on-axis detection subsystem 460 can be configured to receive one or more on-axis diffracted radiation beams (e.g., indicative of first-order diffraction) from the region 490 in response to the illumination of the region 490 by one or more off-axis radiation beams. In some aspects, the on-axis detection subsystem 460 can include an optic configured to collect the on-axis diffracted radiation beams from the region 490. In some aspects, the optic can include a microlens structure. In some aspects, the on-axis detection subsystem 460 can include a multimode dispersion waveguide coupled to one or more sensors. In some aspects, the on-axis detection subsystem 460 can include an angled MMI device. In some aspects, the on-axis detection subsystem 460 can include a wideband grating coupler. In some aspects, the on-axis detection subsystem 460 can include a multi-period grating or a chirped grating. In some aspects, the on-axis detection subsystem 460 can include a multi-level optical coupler. In some aspects, the on-axis detection subsystem 460 can include multi-period gratings with chirp in between peak locations. In some aspects, the on-axis detection subsystem 460 can include a wideband, on-chip optical coupler. In some aspects, the on-axis detection subsystem 460 can include a lensed-top, vertically-curved optical coupler (e.g., an elephant coupler). In some aspects, the on-axis detection subsystem 460 can include a direct laser writing for a lensed vertical optical coupler. In some aspects, the on-axis detection subsystem 460 can include a wideband, wavelength-insensitive in-and-out optical coupler. In some aspects, the on-axis detection subsystem 460 can include an acousto-optical tunable filter (AOTF) configured to generate a grating that mimics the alignment mark pitch. In some aspects, the AOTF can include, or be integrated with, a SAW transducer. In some aspects, the on-axis detection subsystem 460 can include one or more optical couplers, fibers, mirrors, lenses, prisms, beam splitters, wave plates, waveguides, polarizers, polarization rotators, detectors (e.g., photodetectors, photodiodes, charge-coupled devices (CCD) imaging devices, complementary metal-oxide-semiconductor (CMOS) imaging devices, polarimeters, and other suitable detectors), processors, and other suitable structures.

As shown in FIG. 4A, the example metrology system 400 can include a first off-axis illumination subsystem 402A configured to generate a first off-axis radiation beam 482A (e.g., a first beam of substantially coherent radiation) at a first wavelength. In some aspects, the first off-axis illumination subsystem 402A can be further configured to transmit the first off-axis radiation beam 482A to the region 490 of the surface of the substrate 492 at a first off-axis incident angle 472A.

In some aspects, the example metrology system 400 can include a third off-axis illumination subsystem 404A configured to generate a third off-axis radiation beam 484A (e.g., a third beam of substantially coherent radiation) at a third wavelength. In some aspects, the third off-axis illumination subsystem 404A can be further configured to transmit the third off-axis radiation beam 484A to the region 490 at a third off-axis incident angle 474A.

As shown in FIG. 4B, the example metrology system 400 can include a second off-axis illumination subsystem 402B configured to generate a second off-axis radiation beam 483B (e.g., a second beam of substantially coherent radiation) at a second wavelength. In some aspects, the second off-axis illumination subsystem 402B can be further configured to transmit the second off-axis radiation beam 483B to the region 490 at a second off-axis incident angle 473B.

In some aspects, the second wavelength can be equal to about the first wavelength. In some aspects, the second wavelength can be different from the first wavelength. In some aspects, the second off-axis incident angle 473B can be equal to about the first off-axis incident angle 472A (e.g., a magnitude of the second off-axis incident angle 473B can be about equal to a magnitude of the first off-axis incident angle 472A). In some aspects, the second off-axis incident angle 473B can be different from the first off-axis incident angle 472A. In some aspects, a first rotation of the first off-axis radiation beam 482A can be equal to a second rotation of the second off-axis radiation beam 483B. In some aspects, the first rotation of the first off-axis radiation beam 482A can be different from the second rotation of the second off-axis radiation beam 483B (e.g., the first off-axis radiation beam 482A and the second off-axis radiation beam 483B can have the same wavelength but differ in rotation by 90 degrees).

In some aspects, the example metrology system 400 can include a fourth off-axis illumination subsystem 404B configured to generate a fourth off-axis radiation beam 485B (e.g., a fourth beam of substantially coherent radiation) at a fourth wavelength. In some aspects, the fourth off-axis illumination subsystem 404B can be further configured to transmit the fourth off-axis radiation beam 485B to the region 490 at a fourth off-axis incident angle 475B.

In some aspects, the fourth wavelength can be equal to about the third wavelength. In some aspects, the fourth wavelength can be different from the third wavelength. In some aspects, the fourth off-axis incident angle 475B can be equal to about the third off-axis incident angle 474A (e.g., a magnitude of the fourth off-axis incident angle 475B can be about equal to a magnitude of the third off-axis incident angle 474A). In some aspects, the fourth off-axis incident angle 475B can be different from the third off-axis incident angle 474A. In some aspects, a third rotation of the third off-axis radiation beam 484A can be equal to a fourth rotation of the fourth off-axis radiation beam 485B. In some aspects, the third rotation of the third off-axis radiation beam 484A can be different from the fourth rotation of the fourth off-axis radiation beam 485B (e.g., the third off-axis radiation beam 484A and the fourth off-axis radiation beam 485B can have the same wavelength but differ in rotation by 90 degrees).

In some aspects, the example metrology system 400 can further include a coupler (e.g., an optical coupler) configured to receive a multi-wavelength radiation beam from a source illumination subsystem via an optical fiber (e.g., a PM fiber). In some aspects, the coupler can be further configured to transmit a first portion of the multi-wavelength radiation beam to the first off-axis illumination subsystem 402A. In some aspects, the coupler can be further configured to transmit a second portion of the multi-wavelength radiation beam to the second off-axis illumination subsystem 402B. In some aspects, the coupler can be further configured to transmit a third portion of the multi-wavelength radiation beam to the third off-axis illumination subsystem 404A. In some aspects, the coupler can be further configured to transmit a fourth portion of the multi-wavelength radiation beam to the fourth off-axis illumination subsystem 404B.

In some aspects, the first off-axis illumination subsystem 402A can be further configured to receive the first portion of the multi-wavelength radiation beam and generate the first off-axis radiation beam 482A based on the first portion of the multi-wavelength radiation beam. In some aspects, the second off-axis illumination subsystem 402B can be further configured to receive the second portion of the multi-wavelength radiation beam and generate the second off-axis radiation beam 483B based on the second portion of the multi-wavelength radiation beam. In some aspects, the third off-axis illumination subsystem 404A can be further configured to receive the third portion of the multi-wavelength radiation beam and generate the third off-axis radiation beam 484A based on the third portion of the multi-wavelength radiation beam. In some aspects, the fourth off-axis illumination subsystem 404B can be further configured to receive the fourth portion of the multi-wavelength radiation beam and generate the fourth off-axis radiation beam 485B based on the fourth portion of the multi-wavelength radiation beam.

In some aspects, the first off-axis illumination subsystem 402A can include a first phase array configured to steer the first off-axis radiation beam 482A toward the region 490 of the surface of the substrate 492 at the first off-axis incident angle 472A. In some aspects, the first phase array can include a first plurality of phase shifters. In some aspects, the first phase array can include a first plurality of OPMs.

In some aspects, the second off-axis illumination subsystem 402B can include a second phase array configured to steer the second off-axis radiation beam 483B toward the region 490 of the surface of the substrate 492 at the second off-axis incident angle 473B. In some aspects, the second phase array can include a second plurality of phase shifters. In some aspects, the second phase array can include a second plurality of OPMs.

In some aspects, the third off-axis illumination subsystem 404A can include a third phase array configured to steer the third off-axis radiation beam 484A toward the region 490 of the surface of the substrate 492 at the third off-axis incident angle 474A. In some aspects, the third phase array can include a third plurality of phase shifters. In some aspects, the third phase array can include a third plurality of OPMs.

In some aspects, the fourth off-axis illumination subsystem 404B can include a fourth phase array configured to steer the fourth off-axis radiation beam 485B toward the region 490 of the surface of the substrate 492 at the fourth off-axis incident angle 475B. In some aspects, the fourth phase array can include a fourth plurality of phase shifters. In some aspects, the fourth phase array can include a fourth plurality of OPMs.

In some aspects, the first off-axis illumination subsystem 402A and the second off-axis illumination subsystem 402B can include first and second emitters, respectively, of substantially monochromatic radiation at a first wavelength. For example, the first off-axis illumination subsystem 402A can include a positive blue light emitter, and the second off-axis illumination subsystem 402B can include a negative blue light emitter. In some aspects, the third off-axis illumination subsystem 404A and the fourth off-axis illumination subsystem 404B can include third and fourth emitters, respectively, of substantially monochromatic radiation at a second wavelength different from the first wavelength. For example, the third off-axis illumination subsystem 404A can include a positive green light emitter, and the fourth off-axis illumination subsystem 404B can include a negative green light emitter.

In some aspects, each of the first off-axis incident angle 472A, the second off-axis incident angle 473B, the third off-axis incident angle 474A, and the fourth off-axis incident angle 475B can be defined relative to the surface normal of the surface of the substrate 492. In some aspects, an on-axis diffracted radiation beam path 486 (shown in FIG. 4A), an on-axis diffracted radiation beam path 486 (shown in FIG.

4B), or both can be coincident with the surface normal (e.g., the angle between the on-axis diffracted radiation beam path 486 and the surface normal can be about zero). In other aspects, the on-axis diffracted radiation beam path 486, the on-axis diffracted radiation beam path 487, or both can be non-coincident with the surface normal (e.g., the angle between the on-axis diffracted radiation beam path 486 and the surface normal can be non-zero).

In some aspects, the on-axis detection subsystem 460 can be configured to receive, via the on-axis diffracted radiation beam path 486 shown in FIG. 4A, a first on-axis diffracted radiation beam that includes a first set of photons diffracted from the region 490 in response to a first illumination of the region 490 by the first off-axis radiation beam 482A. In some aspects, the first set of photons included in the first on-axis diffracted radiation beam can be indicative of first-order diffraction in response to the first illumination of the region 490 by the first off-axis radiation beam 482A.

In some aspects, the on-axis detection subsystem 460 can be further configured to receive, via the on-axis diffracted radiation beam path 486, a second on-axis diffracted radiation beam that includes a second set of photons diffracted from the region 490 in response to a second illumination of the region 490 by the second off-axis radiation beam 483B. In some aspects, the second set of photons included in the second on-axis diffracted radiation beam can be indicative of first-order diffraction in response to the second illumination of the region 490 by the second off-axis radiation beam 483B.

In some aspects, the on-axis detection subsystem 460 can be further configured to receive, via the on-axis diffracted radiation beam path 487 shown in FIG. 4B, a third on-axis diffracted radiation beam that includes a third set of photons diffracted from the region 490 in response to a third illumination of the region 490 by the third off-axis radiation beam 484A. In some aspects, the third set of photons included in the third on-axis diffracted radiation beam can be indicative of first-order diffraction in response to the third illumination of the region 490 by the third off-axis radiation beam 484A.

In some aspects, the on-axis detection subsystem 460 can be further configured to receive, via the on-axis diffracted radiation beam path 487, a fourth on-axis diffracted radiation beam that includes a fourth set of photons diffracted from the region 490 in response to a fourth illumination of the region 490 by the fourth off-axis radiation beam 485B. In some aspects, the fourth set of photons included in the fourth on-axis diffracted radiation beam can be indicative of first-order diffraction in response to the fourth illumination of the region 490 by the fourth off-axis radiation beam 485B.

In some aspects, a second off-axis detection subsystem included in, or associated with, the second off-axis illumination subsystem 402B can be configured to receive a first off-axis diffracted radiation beam 482B at a first off-axis diffraction angle 472B that includes a first set of photons diffracted from the region 490 in response to a first illumination of the region 490 by the first off-axis radiation beam 482A. In some aspects, the first set of photons included in the first off-axis diffracted radiation beam 482B can be indicative of zero-order diffraction in response to the first illumination of the region 490 by the first off-axis radiation beam 482A.

In some aspects, a first off-axis detection subsystem included in, or associated with, the first off-axis illumination subsystem 402A can be configured to receive a second off-axis diffracted radiation beam 483A at a second off-axis diffraction angle 473A that includes a second set of photons diffracted from the region 490 in response to a second illumination of the region 490 by the second off-axis radiation beam 483B. In some aspects, the second set of photons included in the second off-axis diffracted radiation beam 483A can be indicative of zero-order diffraction in response to the second illumination of the region 490 by the second off-axis radiation beam 483B.

In some aspects, a fourth off-axis detection subsystem included in, or associated with, the fourth off-axis illumination subsystem 404B can be configured to receive a third off-axis diffracted radiation beam 484B at a third off-axis diffraction angle 474B that includes a third set of photons diffracted from the region 490 in response to a third illumination of the region 490 by the third off-axis radiation beam 484A. In some aspects, the third set of photons included in the third off-axis diffracted radiation beam 484B can be indicative of zero-order diffraction in response to the third illumination of the region 490 by the third off-axis radiation beam 484A.

In some aspects, a third off-axis detection subsystem included in, or associated with, the third off-axis illumination subsystem 404A can be configured to receive a fourth off-axis diffracted radiation beam 485A at a fourth off-axis diffraction angle 475A that includes a fourth set of photons diffracted from the region 490 in response to a fourth illumination of the region 490 by the fourth off-axis radiation beam 485B. In some aspects, the fourth set of photons included in the fourth off-axis diffracted radiation beam 485A can be indicative of zero-order diffraction in response to the fourth illumination of the region 490 by the fourth off-axis radiation beam 485B.

In some aspects, the first off-axis diffraction angle 472B can be equal to about the second off-axis diffraction angle 473A (e.g., a magnitude of the first off-axis diffraction angle 472B can be about equal to a magnitude of the second off-axis diffraction angle 473A). In some aspects, the first off-axis diffraction angle 472B can be different from the second off-axis diffraction angle 473A. In some aspects, the third off-axis diffraction angle 474B can be equal to about the fourth off-axis diffraction angle 475A (e.g., a magnitude of the third off-axis diffraction angle 474B can be about equal to a magnitude of the fourth off-axis diffraction angle 475A). In some aspects, the third off-axis diffraction angle 474B can be different from the fourth off-axis diffraction angle 475A.

In some aspects, the on-axis detection subsystem 460 can be further configured to generate an electronic signal based on: the first on-axis diffracted radiation beam (e.g., the first set of photons) propagated along the on-axis diffracted radiation beam path 486; the second on-axis diffracted radiation beam (e.g., the second set of photons) propagated along the on-axis diffracted radiation beam path 486; the third on-axis diffracted radiation beam (e.g., the third set of photons) propagated along the on-axis diffracted radiation beam path 486; the fourth on-axis diffracted radiation beam (e.g., the fourth set of photons) propagated along the on-axis diffracted radiation beam path 486; the first off-axis diffracted radiation beam 482B (e.g., a fifth set of photons); the second off-axis diffracted radiation beam 483A (e.g., a sixth set of photons); the third off-axis diffracted radiation beam 484B (e.g., a seventh set of photons); the fourth off-axis diffracted radiation beam 485A (e.g., an eighth set of photons); or any combination thereof.

In some aspects, the electronic signal can include a first alignment sub-signal indicative of a first phase difference between the first on-axis diffracted radiation beam and the second on-axis diffracted radiation beam propagated along the on-axis diffracted radiation beam path 486. In some aspects, the electronic signal can further include a second alignment sub-signal indicative of a second phase difference between the third on-axis diffracted radiation beam and the fourth on-axis diffracted radiation beam. In some aspects, the electronic signal can include a first level sub-signal indicative of a first intensity difference between the first off-axis diffracted radiation beam 482B and the second off-axis diffracted radiation beam 483A. In some aspects, the electronic signal can further include a second level sub-signal indicative of a second intensity difference between the third off-axis diffracted radiation beam 484B and the fourth off-axis diffracted radiation beam 485A.

In some aspects, the on-axis detection subsystem 460 can be further configured to determine a correction to a determined alignment, position, or both of the alignment grating structure 494 based on the electronic signal or any portion (e.g., first alignment sub-signal, second alignment sub-signal, first level sub-signal, second level sub-signal) or combination of portions thereof.

Figure 5:
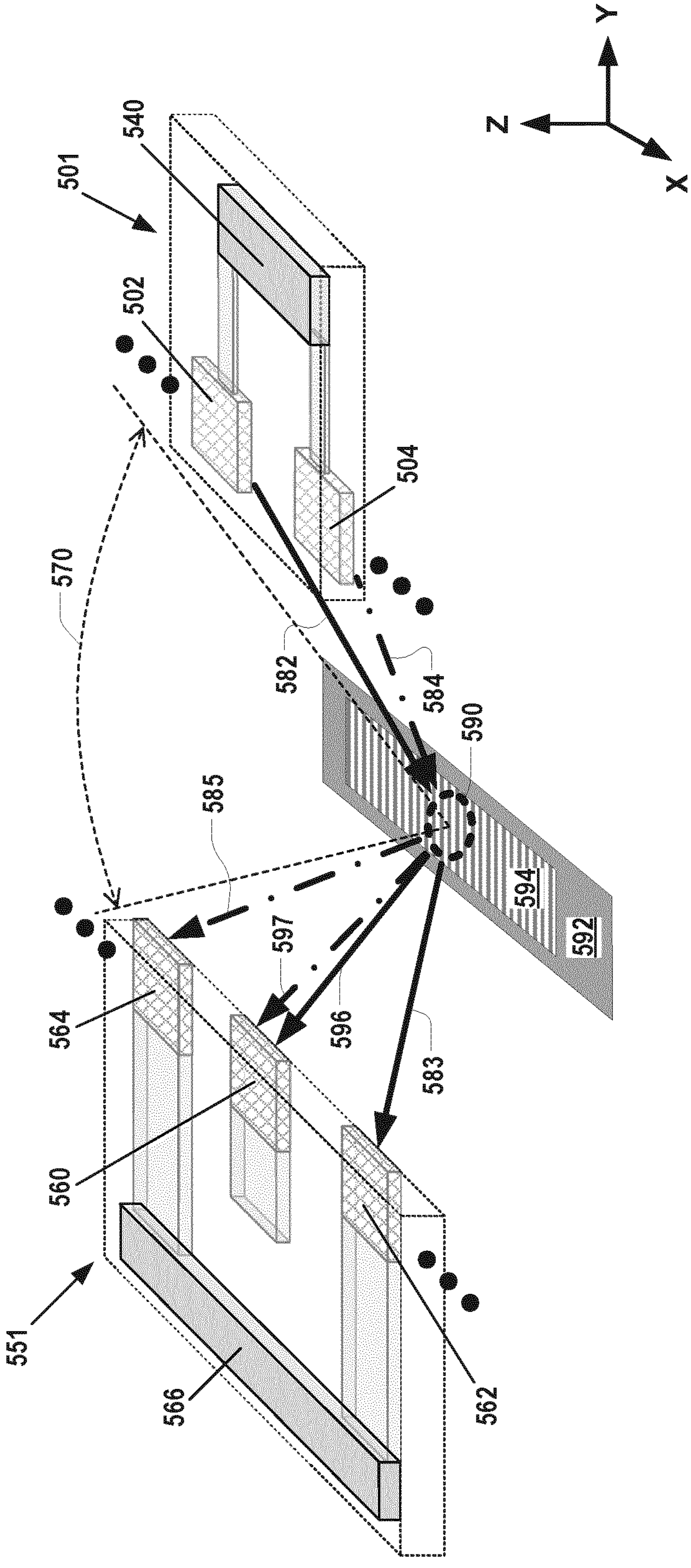
FIG. 5 is a schematic illustration of another example metrology system according to some aspects of the present disclosure.

FIG. 5 is a schematic illustration of an example metrology system 500 utilizing off-axis illumination for performing intensity and phase measurements according to some aspects of the present disclosure. In some aspects, the example metrology system 500, or any portion thereof, can be implemented using any of the structures, components, features, or techniques described with reference to the example metrology system 400 described with reference to FIG. 4; the example metrology system 600 described with reference to FIGS. 6A, 6B, 6C, 6D, 6E, 6F, and 6G; the example metrology system 700 described with reference to FIG. 7; the example metrology system 800 described with reference to FIG. 8; the example metrology system 900 described with reference to FIG. 9; the example metrology system 1000 described with reference to FIG. 10; the example computing system 1200 described with reference to FIG. 12; any other suitable structure, component, feature, or technique; any portion thereof; or any combination thereof.

As shown in FIG. 5, in some aspects, the example metrology system 500 can include a first integrated optical device 501 (e.g., a single-chip silicon nitride-based system than can be referred to as an "illumination chip") that can include an optical coupler 540, a first off-axis illumination system 502, and a second off-axis illumination system 504.

In some aspects, the first off-axis illumination system 502 can be configured to generate (e.g., based on radiation received from an illumination source via the optical coupler 540) a first off-axis radiation beam 582 at a first wavelength and transmit (e.g., emit) the first off-axis radiation beam 582 toward a region 590 of a surface 592 of a substrate 594 at a first incident angle. In some aspects, an area of the region 590 can be less than or equal to about 1.0 square millimeter ($mm^2$), 0.5 $mm^2$, 0.1 $mm^2$, 1,000 square micrometers ($\mu m_2$), or any other suitable area. In some aspects, the first off-axis illumination system 502 can include a first phase array configured to steer the first off-axis radiation beam 582 toward the region 590 at the first incident angle. In some aspects, the first phase array can include a first plurality of phase shifters. In some aspects, the first phase array can include a first plurality of phase shifters (e.g., OPMs).

In some aspects, the second off-axis illumination system 504 can be configured to generate (e.g., based on radiation received from an illumination source via the optical coupler 540) a second off-axis radiation beam 584 at a second wavelength and transmit (e.g., emit) the second off-axis radiation beam 584 toward the region 590 at a second incident angle. In some aspects, the second off-axis illumination system 504 can include a second phase array configured to steer the second off-axis radiation beam 584 toward the region 590 at the second incident angle. In some aspects, the second phase array can include a second plurality of phase shifters. In some aspects, the second phase array can include a second plurality of phase shifters (e.g., OPMs).

In some aspects, the second wavelength can be equal to about the first wavelength. In some aspects, the second wavelength can be different from the first wavelength. In some aspects, the second incident angle can be equal to about the first incident angle. In some aspects, the second incident angle can be different from the first incident angle.

In some aspects, the optical coupler 540 can be configured to receive an incoherent radiation beam from an illumination source via an optical fiber, transmit a first substantially coherent portion of the incoherent radiation beam to the first off-axis illumination system 502, and transmit a second substantially coherent portion of the incoherent radiation beam to the second off-axis illumination system 504. In some aspects, the first off-axis illumination system 502 can be configured to receive the first substantially coherent portion of the incoherent radiation beam and generate the first off-axis radiation beam 582 based on the first substantially coherent portion of the incoherent radiation beam. In some aspects, the first off-axis radiation beam 582 can be a coherent radiation beam at the first wavelength. In some aspects, the second off-axis illumination system 504 can be configured to receive the second substantially coherent portion of the incoherent radiation beam and generate the second off-axis radiation beam 584 based on the second substantially coherent portion of the incoherent radiation beam. In some aspects, the second off-axis radiation beam 584 can be a substantially coherent radiation beam at the second wavelength.

In one illustrative and non-limiting example, the second wavelength can be substantially equal to the first wavelength, and the second incident angle can be substantially equal to the first incident angle (e.g., the first angle can be +15 degrees, and the second angle can be −15 degrees, from the surface normal of the surface 592 at the region 590). The first integrated optical device 501 can be configured to provide off-axis simultaneous illumination (e.g., for use in determining position or level based on intensity imbalance in zero-order diffraction) by emitting (e.g., by the first off-axis illumination system 502 and the second off-axis illumination system 504, respectively) the first off-axis radiation beam 582 and the second off-axis radiation beam 584 at substantially the same time. In another illustrative and non-limiting example, the first integrated optical device 501 can be configured to provide off-axis staggered illumination (e.g., for use in determining alignment mark asymmetry based on intensity and/or phase difference in first-order diffraction) by emitting (e.g., by the first off-axis illumination system 502) the first off-axis radiation beam 582 at a first time and then emitting (e.g., by the second off-axis illumination system 504) the second off-axis radiation beam 584 at a second time later than the first time.

In some aspects, the example metrology system 500 can further include a second integrated optical device 551 (e.g., a single-chip silicon nitride-based system than can be referred to as a "detection chip") that can include an on-axis detection system 560, a first off-axis detection system 562, a second off-axis detection system 564, and a controller 566 (e.g., a decision circuit). In some aspects, the first integrated optical device 501 and the second integrated optical device 551 can be implemented in the same integrated optical device (e.g., single chip, single substrate, or single package). In some aspects, the first off-axis illumination system 502 can include the second off-axis detection system 564, and the second off-axis illumination system 504 can include the first off-axis detection system 562.

In some aspects, the on-axis detection system 560 configured to measure a first on-axis diffracted radiation beam 596 at the first wavelength and diffracted from the region 590 at a first on-axis diffraction angle that can be substantially coincident with the surface normal in response to a first illumination of the region 590 by the first off-axis radiation beam 582. In some aspects, the first on-axis diffracted radiation beam 596 can be indicative of positive first-order diffraction in response to the first illumination of the region 590 by the first off-axis radiation beam 582. In some aspects, the on-axis detection system 560 can be further configured to generate a first on-axis measurement signal based on the first on-axis diffracted radiation beam 596.

In some aspects, the on-axis detection system 560 can be further configured to measure a second on-axis diffracted radiation beam 597 at the second wavelength and diffracted from the region 590 at a second on-axis diffraction angle that can be substantially coincident with the surface normal in response to a second illumination of the region 590 by the second off-axis radiation beam 584. In some aspects, the second on-axis diffracted radiation beam 597 can be indicative of negative first-order diffraction in response to the second illumination of the region 590 by the second off-axis radiation beam 584. In some aspects, the on-axis detection system 560 can be further configured to generate a second on-axis measurement signal based on the second off-axis diffracted radiation beam 585.

In some aspects, the first off-axis detection system 562 can be configured to measure a first off-axis diffracted radiation beam 583 at the first wavelength and diffracted from the region 590 at a first off-axis diffraction angle in response to the first illumination of the region 590 by the first off-axis radiation beam 582. In some aspects, the first off-axis diffracted radiation beam 583 can be indicative of zero-order diffraction in response to the first illumination of the region 590 by the first off-axis radiation beam 582. In some aspects, the first off-axis detection system 562 can be further configured to generate a first off-axis measurement signal based on the first off-axis diffracted radiation beam 583.

In some aspects, the second off-axis detection system 564 can be configured to measure a second off-axis diffracted radiation beam 585 at the second wavelength and diffracted from the region 590 at a second off-axis diffraction angle in response to the second illumination of the region 590 by the second off-axis radiation beam 584. In some aspects, the second off-axis diffracted radiation beam 585 can be indicative of zero-order diffraction in response to the second illumination of the region 590 by the second off-axis radiation beam 584. In some aspects, the second off-axis detection system 564 can be further configured to generate a second off-axis measurement signal based on the second off-axis diffracted radiation beam 585.

In some aspects, a first two-dimensional plane (not depicted) can include the first off-axis radiation beam 582 and the second off-axis radiation beam 584. In some aspects, a second two-dimensional plane (not depicted) can include the first off-axis diffracted radiation beam 583 and the second off-axis diffracted radiation beam 585. In some aspects, a dihedral angle 570 between the first two-dimensional plane and the second two-dimensional plane can be non-zero.

In some aspects, the controller 566 can be configured to generate an electronic signal (e.g., measurement data for the region 590) based on the first on-axis measurement signal, the second on-axis measurement signal, the first off-axis measurement signal, the second off-axis measurement signal, any other suitable signal or data, or any combination thereof.

In some aspects, the first off-axis measurement signal can be indicative of zero-order diffraction (e.g., as shown by the first off-axis diffracted radiation beam 583) resulting from illumination of the region 590 by the first off-axis radiation beam 582. In some aspects, the second off-axis measurement signal can be indicative of zero-order diffraction (e.g., as shown by the second off-axis diffracted radiation beam 585) resulting from illumination of the region 590 by the second off-axis radiation beam 584. In some aspects, the controller 566 can be configured to generate a level signal (e.g., an intensity imbalance signal) based on the first off-axis measurement signal and the second off-axis measurement signal (e.g., based on an intensity difference between the first off-axis diffracted radiation beam 583 and the second off-axis diffracted radiation beam 585). In some aspects, the controller 566 can be further configured to determine a level position (e.g., height in the Z-direction) of the region 590 based on the level signal. In some aspects, the controller 566 can be further configured to correct the determined level position based on the level signal (e.g., based on the intensity imbalance between the first off-axis diffracted radiation beam 583 and the second off-axis diffracted radiation beam 585).

In some aspects, the first on-axis measurement signal can be indicative of first-order diffraction (e.g., as shown by the first on-axis diffracted radiation beam 596) resulting from illumination of the region 590 by the first off-axis radiation beam 582. In some aspects, the second on-axis measurement signal can be indicative of first-order diffraction (e.g., as shown by the second on-axis diffracted radiation beam 597) resulting from illumination of the region 590 by the second off-axis radiation beam 584. In some aspects, the controller 566 can be configured to generate an alignment signal based on the first on-axis measurement signal and the second on-axis measurement signal (e.g., based on an intensity and/or phase difference between the first on-axis diffracted radiation beam 596 and the second on-axis diffracted radiation beam 597). In some aspects, the region 590 can include a set of alignment marks, and the controller 566 can be further configured to generate alignment mark deformation data for the set of alignment marks based on the alignment signal. In some aspects, the region 590 can include a portion of an alignment grating structure that includes the set of alignment marks, and the controller 566 can be further configured to determine an alignment position of the alignment grating structure based on the alignment mark deformation data. In some aspects, the controller 566 can be further configured to correct the determined alignment position based on the alignment mark deformation data. In some aspects, the controller 566 can be further configured to determine a set of corrections to a set of measured alignment positions of the set of alignment marks based on the alignment mark deformation data.

FIGS. 6A, 6B, 6C, 6D, 6E, 6F, and 6G are schematic illustrations of an example metrology system 600 utilizing off-axis illumination for performing intensity and phase measurements according to some aspects of the present disclosure. In some aspects, the example metrology system 600, or any portion thereof, can be implemented using any of the structures, components, features, or techniques described with reference to the example metrology system 400 described with reference to FIG. 4; the example metrology system 500 described with reference to FIG. 5; the example metrology system 700 described with reference to FIG. 7; the example metrology system 800 described with reference to FIG. 8; the example metrology system 900 described with reference to FIG. 9; the example metrology system 1000 described with reference to FIG. 10; the example computing system 1200 described with reference to FIG. 12; any other suitable structure, component, feature, or technique; any portion thereof; or any combination thereof.

Figure 6A:
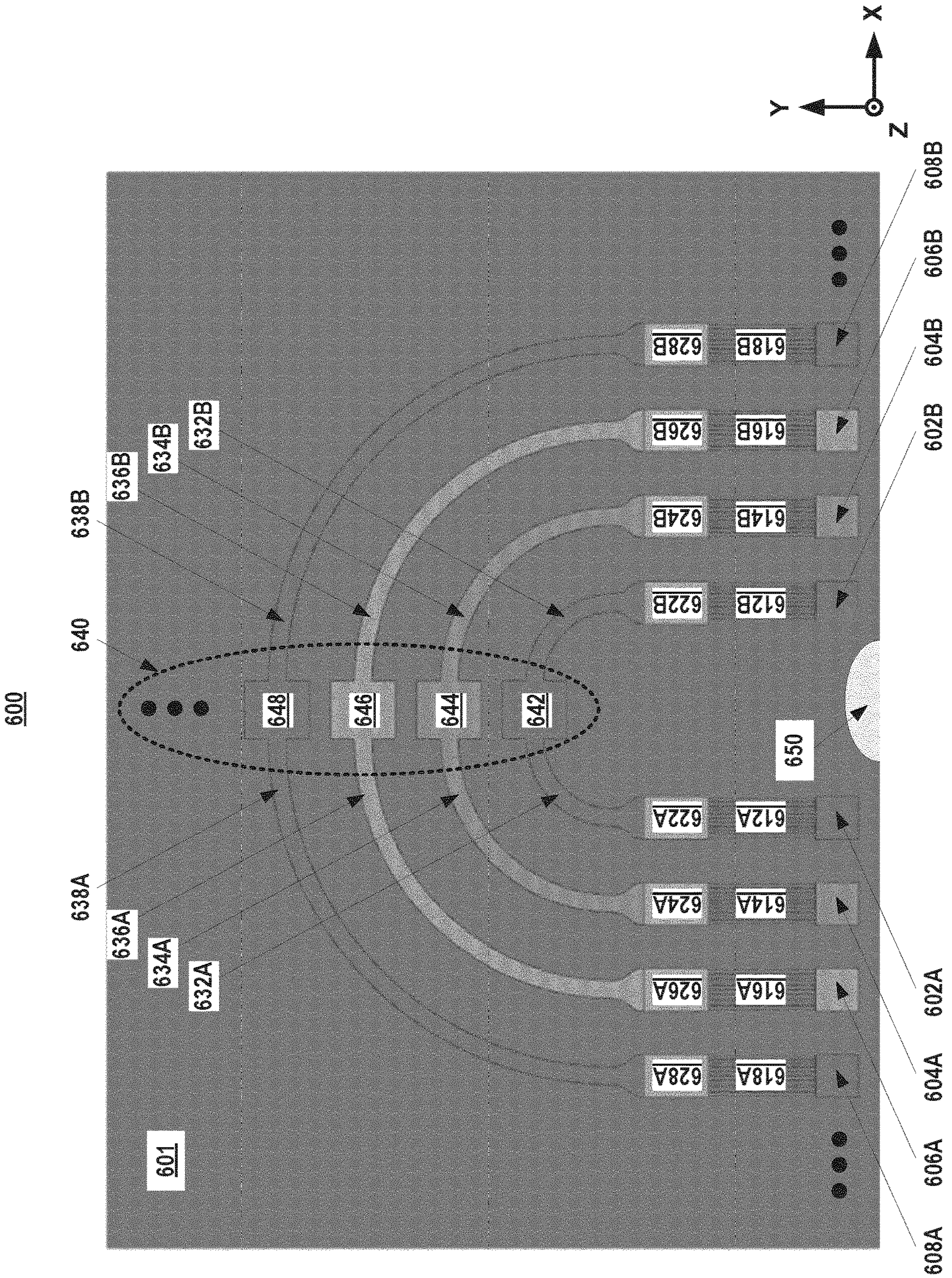
FIGS. 6A, 6B, 6C, 6D, 6E, 6F, and 6G are schematic illustrations of an example metrology system according to some aspects of the present disclosure.

As shown in FIG. 6A, the example metrology system 600 can include an integrated optical device (e.g., a single-chip silicon nitride-based system) that can include: an integrated optical device substrate 601; a plurality of off-axis illumination subsystems; an optical coupler 640 configured to be optically coupled to each of the plurality of off-axis illumination subsystems (e.g., coherent radiation sources) and a source illumination subsystem (e.g., a multi-wavelength radiation source); and a detection subsystem that can include an optic 650 (e.g., a microlens structure).

In some aspects, as shown in FIG. 6A, the plurality of off-axis illumination subsystems can be disposed substantially parallel to the X-axis. In other aspects, the plurality of off-axis illumination subsystems can be disposed substantially parallel to the Y-axis. In still other aspects, the plurality of off-axis illumination subsystems can include (i) a first subset of the plurality of off-axis illumination subsystems disposed substantially parallel to the X-axis and (ii) a second subset of the plurality of off-axis illumination subsystems disposed substantially parallel to the Y-axis. In some aspects, one or more of the emitters described with reference to FIG. 6A, 6B, 6C, 6D, 6E, 6F, or 6G can function as both an illuminator and a detector. In some aspects, one or more of the phase arrays described with reference to FIG. 6A, 6B, 6C, 6D, 6E, 6F, or 6G can include a phase shifter, a phase modulator (e.g., an OPM), any other suitable component or structure, or any combination thereof.

In some aspects, as shown in FIG. 6A, the plurality of off-axis illumination subsystems can include: (i) a first off-axis illumination subsystem that includes an emitter 602A, a grating structure 612A (e.g., $Si_3N_4$ grating), and a phase array 622A; (ii) a second off-axis illumination subsystem that includes an emitter 602B, a grating structure 612B, and a phase array 622B; (iii) a third off-axis illumination subsystem that includes an emitter 604A, a grating structure 614A, and a phase array 624A; (iv) a fourth off-axis illumination subsystem that includes an emitter 604B, a grating structure 614B, and a phase array 624B; (v) a fifth off-axis illumination subsystem that includes an emitter 606A, a grating structure 616A, and a phase array 626A; (vi) a sixth off-axis illumination subsystem that includes an emitter 606B, a grating structure 616B, and a phase array 626B; (vii) a seventh off-axis illumination subsystem that includes an emitter 608A, a grating structure 618A, and a phase array 628A; (viii) an eighth off-axis illumination subsystem that includes an emitter 608B, a grating structure 618B, and a phase array 628B; any other suitable illumination subsystem, device, or structure; or any combination thereof. In some aspects, one or more of the emitters can function as both an illuminator and a detector. In some aspects, one or more of the phase arrays can include a phase shifter, a phase modulator (e.g., an OPM), or any other suitable component or structure.

In some aspects, the optical coupler 640 can include an input structure that is configured to be optically coupled to a source illumination subsystem disposed optically upstream of the optical coupler 640. In some aspects, the optical coupler 640 can have a plurality of output structures, where each of the plurality of output structures is configured to be optically coupled a respective one of the plurality of off-axis illumination subsystems disposed optically downstream of the optical coupler 640. In some aspects, the optical coupler 640 can be configured to receive multi-wavelength radiation from the source illumination subsystem, filter the received multi-wavelength radiation into a plurality of coherent radiation beams each at a different wavelength, and transmit each of the plurality of coherent radiation beams to a respective one of the plurality of off-axis illumination subsystems via a respective optical path structure (e.g., a respective optical fiber, waveguide, or other suitable optical transmission structure). In some aspects, the optical coupler 640 can be configured to transmit each of the plurality of coherent radiation beams to two of the plurality of off-axis illumination subsystems (e.g., two off-axis illumination subsystems disposed substantially parallel to the X-axis or the Y-axis) via two separate optical path structures. In some aspects, the optical coupler 640 can be configured to transmit each of the plurality of coherent radiation beams to four of the plurality of off-axis illumination subsystems (e.g., two off-axis illumination subsystems disposed substantially parallel to the X-axis and another two off-axis illumination subsystems disposed substantially parallel to the Y-axis) via four separate optical path structures.

In some aspects, the optical coupler 640 can include an optical filter structure 642 configured to filter the received multi-wavelength radiation into a first radiation beam at a first wavelength (e.g., blue light), transmit a "positive" first radiation beam to the first off-axis illumination subsystem (e.g., to the phase array 622A) via an optical path structure 632A, and transmit a "negative" first radiation beam (e.g., which can be the same as the "positive" first radiation beam or a modified (e.g., rotated by 90 degrees) version of the "positive" first radiation beam) to the second off-axis illumination subsystem (e.g., to the phase array 622B) via an optical path structure 632B.

In some aspects, the optical coupler 640 can include an optical filter structure 644 configured to filter the received multi-wavelength radiation into a second radiation beam at a second wavelength (e.g., green light), transmit a "positive" second radiation beam to the third off-axis illumination subsystem (e.g., to the phase array 624A) via an optical path structure 634A, and transmit a "negative" second radiation beam (e.g., which can be the same as the "positive" second radiation beam or a modified (e.g., rotated by 90 degrees) version of the "positive" second radiation beam) to the fourth off-axis illumination subsystem (e.g., to the phase array 624B) via an optical path structure 634B.

In some aspects, the optical coupler 640 can include an optical filter structure 646 configured to filter the received multi-wavelength radiation into a third radiation beam at a third wavelength (e.g., orange light), transmit a "positive" third radiation beam to the fifth off-axis illumination subsystem (e.g., to the phase array 626A) via an optical path structure 636A, and transmit a "negative" third radiation beam (e.g., which can be the same as the "positive" third radiation beam or a modified (e.g., rotated by 90 degrees) version of the "positive" third radiation beam) to the sixth off-axis illumination subsystem (e.g., to the phase array 626B) via an optical path structure 636B.

In some aspects, the optical coupler 640 can include an optical filter structure 648 configured to filter the received multi-wavelength radiation into a fourth radiation beam at a fourth wavelength (e.g., red light), transmit a "positive" fourth radiation beam to the seventh off-axis illumination subsystem (e.g., to the phase array 628A) via an optical path structure 638A, and transmit a "negative" fourth radiation beam (e.g., which can be the same as the "positive" fourth radiation beam or a modified (e.g., rotated by 90 degrees) version of the "positive" fourth radiation beam) to the eighth off-axis illumination subsystem (e.g., to the phase array 628B) via an optical path structure 638B.

In some aspects, each of the plurality of off-axis illumination subsystems can be configured to emit a radiation beam towards a region of a surface of a substrate at a different incident angle. In some aspects, the region can include a portion of an alignment grating structure. In some aspects, the optic 650 can be configured to receive one or more diffracted radiation beams (e.g., indicative of first-order diffraction) from the region of the surface of the substrate in response to illumination of the region by the radiation beams emitted by the plurality of off-axis illumination subsystem.

Figure 6B:
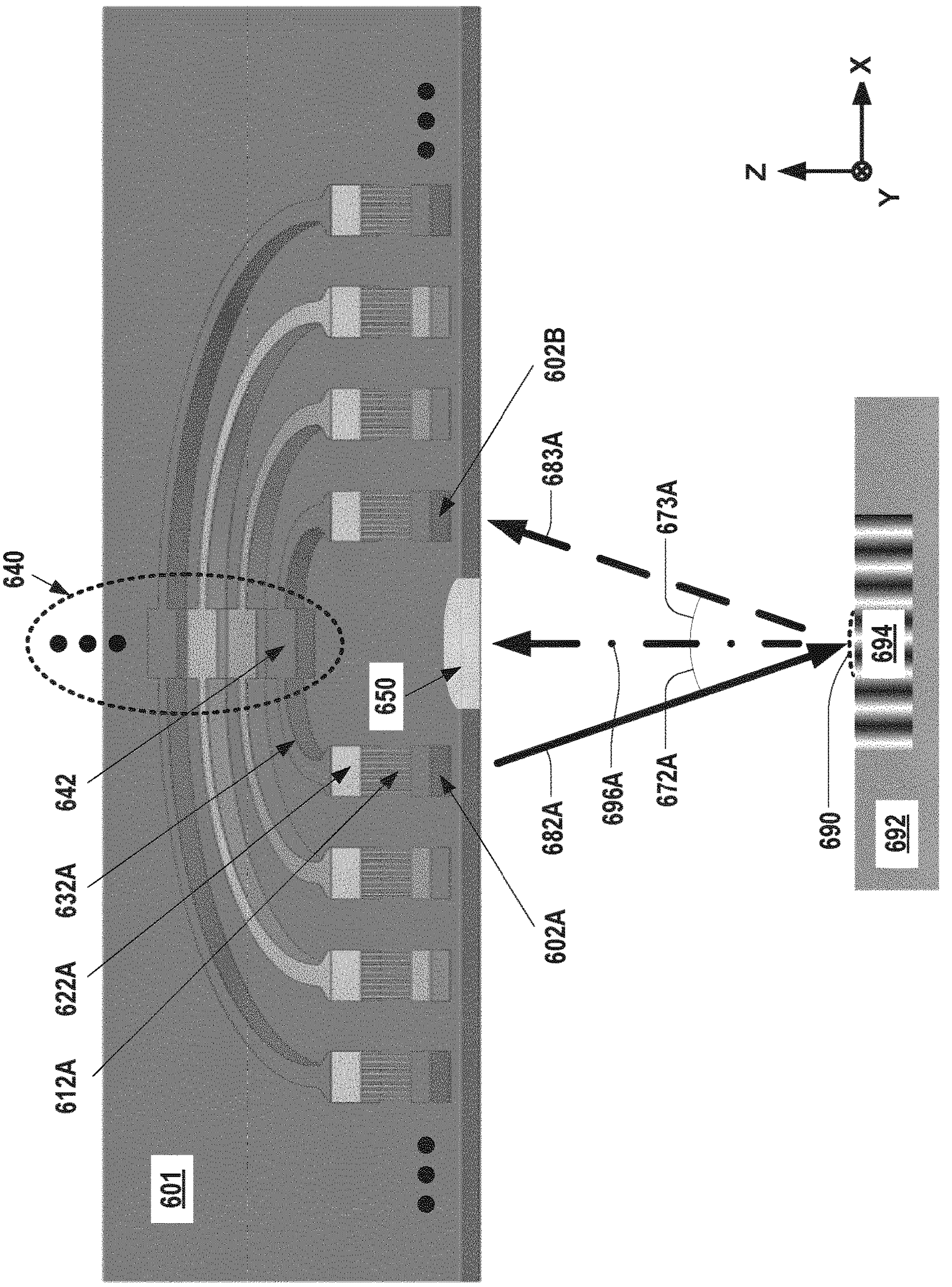
Figure 6C:
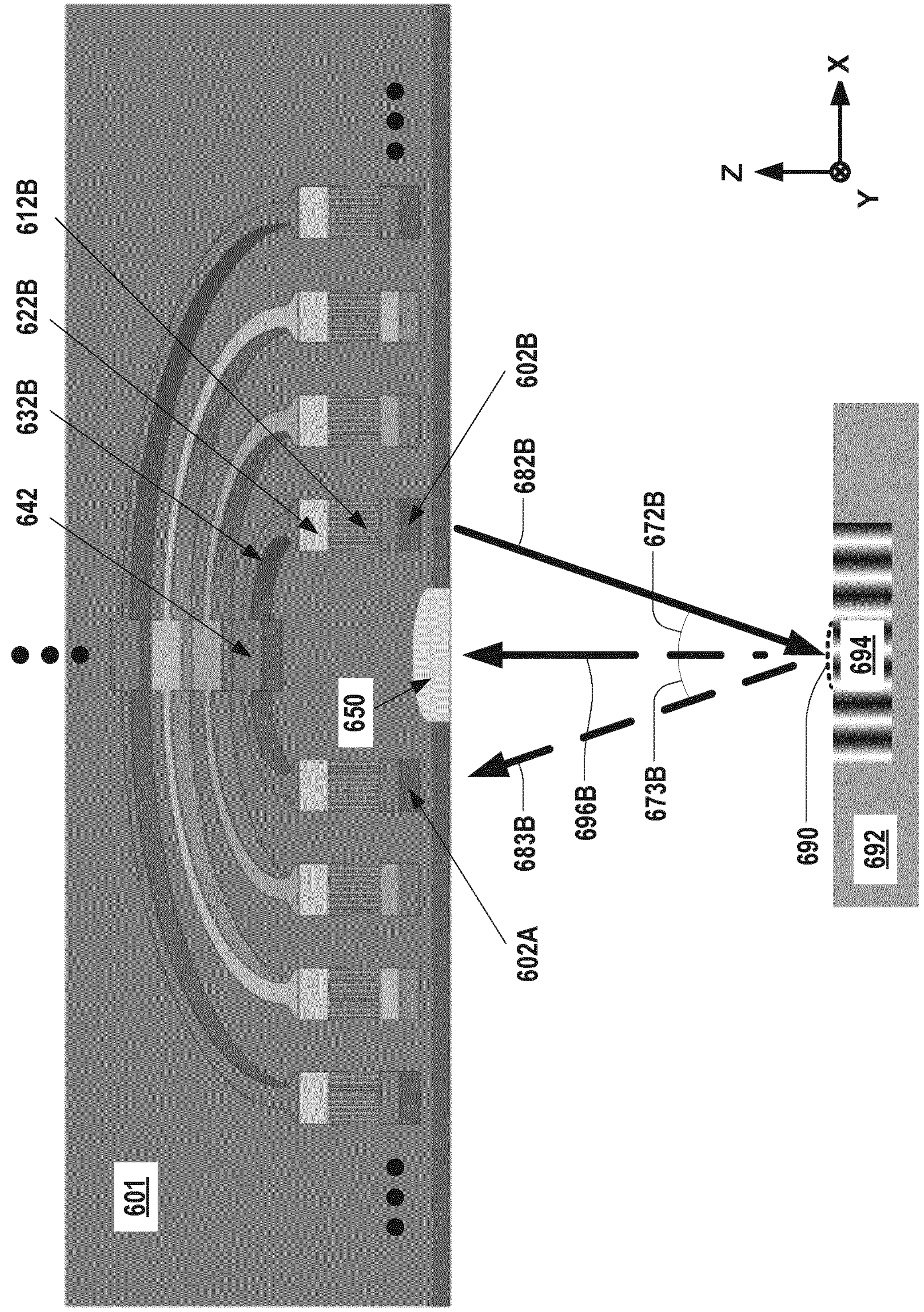

As shown in FIGS. 6B and 6C, in some aspects, the plurality of off-axis illumination subsystems can include the first off-axis illumination subsystem that includes the emitter 602A, the grating structure 612A, and the phase array 622A. In some aspects, the plurality of off-axis illumination subsystems can include the second off-axis illumination subsystem that includes the emitter 602B, the grating structure 612B, and the phase array 622B. In some aspects, the optical coupler 640 can be configured to receive multi-wavelength radiation (e.g., incoherent radiation such as white light) from the source illumination subsystem. In some aspects, the optical coupler 640 can include the optical filter structure 642. The optical filter structure 642 can be configured to filter the received multi-wavelength radiation into a stream of photons at a first wavelength (e.g., blue light), transmit a first "positive" stream of photons at the first wavelength to the first off-axis illumination subsystem (e.g., to the phase array 622A and then to the grating structure 612A and subsequently to the emitter 602A) via the optical path structure 632A, and transmit a first "negative" stream of photons at the first wavelength to the second off-axis illumination subsystem (e.g., to the phase array 622B and then to the grating structure 612B and subsequently to the emitter 602B) via the optical path structure 632B. In some aspects, the first "negative" stream of photons can be the same as the first "positive" stream of photons. In other aspects, the first "negative" stream of photons can be different from the first "positive" stream of photons. For example, the first "negative" stream of photons can be a modified (e.g., rotated by 90 degrees) version of the first "positive" stream of photons.

As shown in FIG. 6B, in some aspects, the first off-axis illumination subsystem can be configured to generate an off-axis radiation beam 682A (e.g., a beam of substantially coherent radiation at the first wavelength) based on the first "positive" stream of photons. In some aspects, the first off-axis illumination subsystem can be further configured to transmit the off-axis radiation beam 682A to a region 690 of a surface of a substrate 692 at an off-axis incident angle 672A. In some aspects, the region 690 can include a portion of an alignment grating structure 694.

In some aspects, the detection subsystem can be configured to receive, via the optic 650, an on-axis diffracted radiation beam 696A that includes a set of photons diffracted from the region 690 in response to an illumination of the region 690 by the off-axis radiation beam 682A. In some aspects, the set of photons included in the on-axis diffracted radiation beam 696A can be indicative of first-order diffraction in response to the illumination of the region 690 by the off-axis radiation beam 682A.

In some aspects, the emitter 602B can be configured to receive an off-axis diffracted radiation beam 683A that includes a set of photons diffracted from the region 690 at an off-axis diffraction angle 673A in response to the illumination of the region 690 by the off-axis radiation beam 682A. In some aspects, the set of photons included in the off-axis diffracted radiation beam 683A can be indicative of zero-order diffraction in response to the illumination of the region 690 by the off-axis radiation beam 682A.

In some aspects, the off-axis incident angle 672A and the off-axis diffraction angle 673A can be defined relative to the surface normal of the surface of the substrate 692. In some aspects, the magnitude of the off-axis incident angle 672A can be about the same as (e.g., about equal to) the magnitude of the off-axis diffraction angle 673A. In some aspects, the on-axis diffracted radiation beam 696A can be coincident with the surface normal (e.g., the angle between the on-axis diffracted radiation beam 696A and the surface normal can be about zero). In other aspects, the on-axis diffracted radiation beam 696A can be non-coincident with the surface normal (e.g., the angle between the on-axis diffracted radiation beam 696A and the surface normal can be non-zero, such as about 1.0 degree, about 3.0 degrees, or about 10.0 degrees).

As shown in FIG. 6C, in some aspects, the second off-axis illumination subsystem can be configured to generate an off-axis radiation beam 682B (e.g., a beam of substantially coherent radiation at the first wavelength) based on the first "negative" stream of photons. In some aspects, the second off-axis illumination subsystem can be further configured to transmit the off-axis radiation beam 682B to the region 690 at an off-axis incident angle 672B.

In some aspects, the detection subsystem can be configured to receive, via the optic 650, an on-axis diffracted radiation beam 696B that includes a set of photons diffracted from the region 690 in response to an illumination of the region 690 by the off-axis radiation beam 682B. In some aspects, the set of photons included in the on-axis diffracted radiation beam 696B can be indicative of first-order diffraction in response to the illumination of the region 690 by the off-axis radiation beam 682B.

In some aspects, the emitter 602A can be configured to receive an off-axis diffracted radiation beam 683B that includes a set of photons diffracted from the region 690 at an off-axis diffraction angle 673B in response to the illumination of the region 690 by the off-axis radiation beam 682B. In some aspects, the set of photons included in the off-axis diffracted radiation beam 683B can be indicative of zero-order diffraction in response to the illumination of the region 690 by the off-axis radiation beam 682B.

As shown in FIG. 6C, the off-axis incident angle 672B and the off-axis diffraction angle 673B can be defined relative to the surface normal of the surface of the substrate 692. In some aspects, the magnitude of the off-axis incident angle 672B can be about the same as (e.g., about equal to) the magnitude of the off-axis diffraction angle 673B. In some aspects, the on-axis diffracted radiation beam 696B can be coincident with the surface normal (e.g., the angle between the on-axis diffracted radiation beam 696B and the surface normal can be about zero). In other aspects, the on-axis diffracted radiation beam 696B can be non-coincident with the surface normal (e.g., the angle between the on-axis diffracted radiation beam 696B and the surface normal can be non-zero).

Figure 6D:
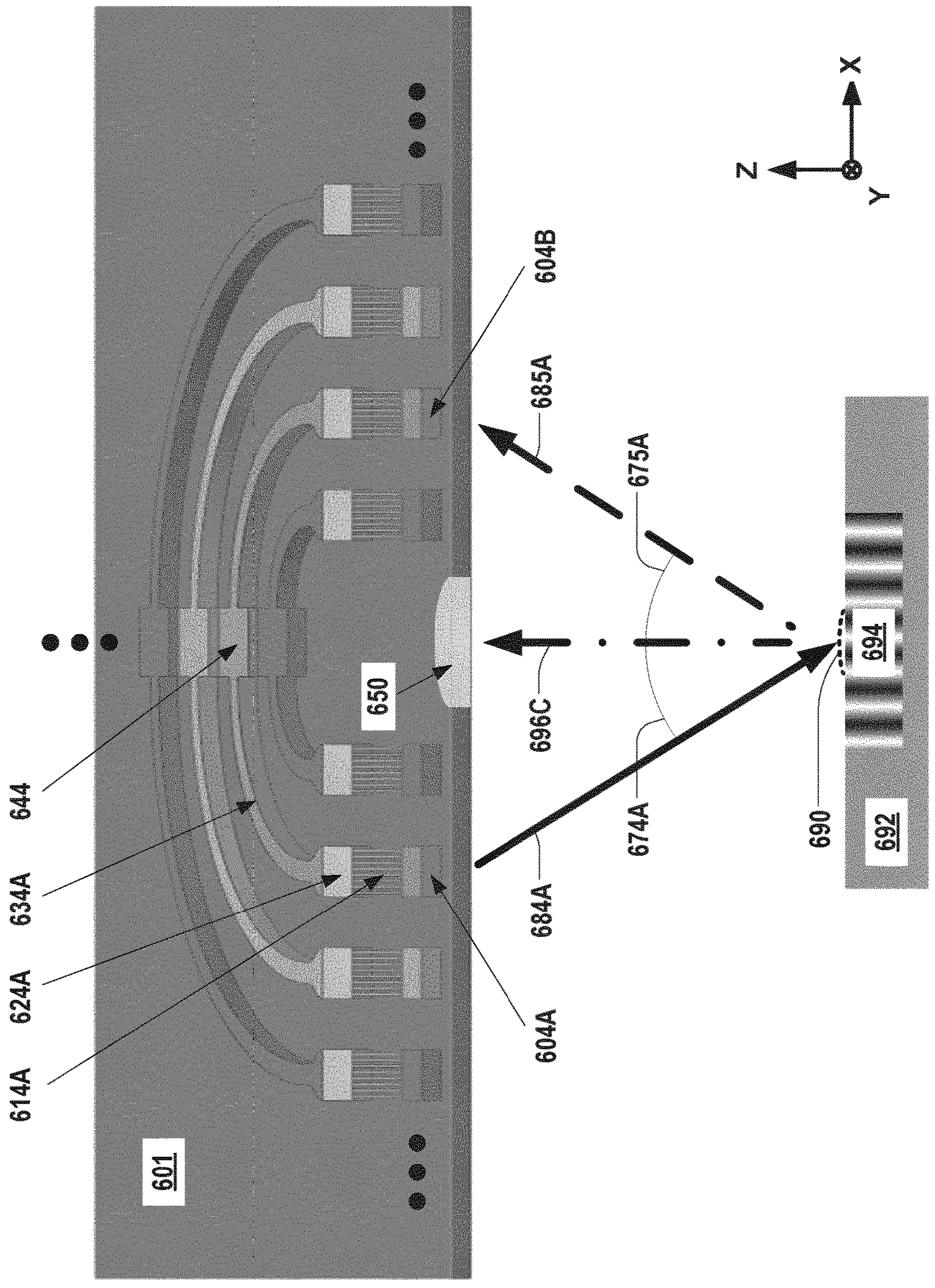
Figure 6E:
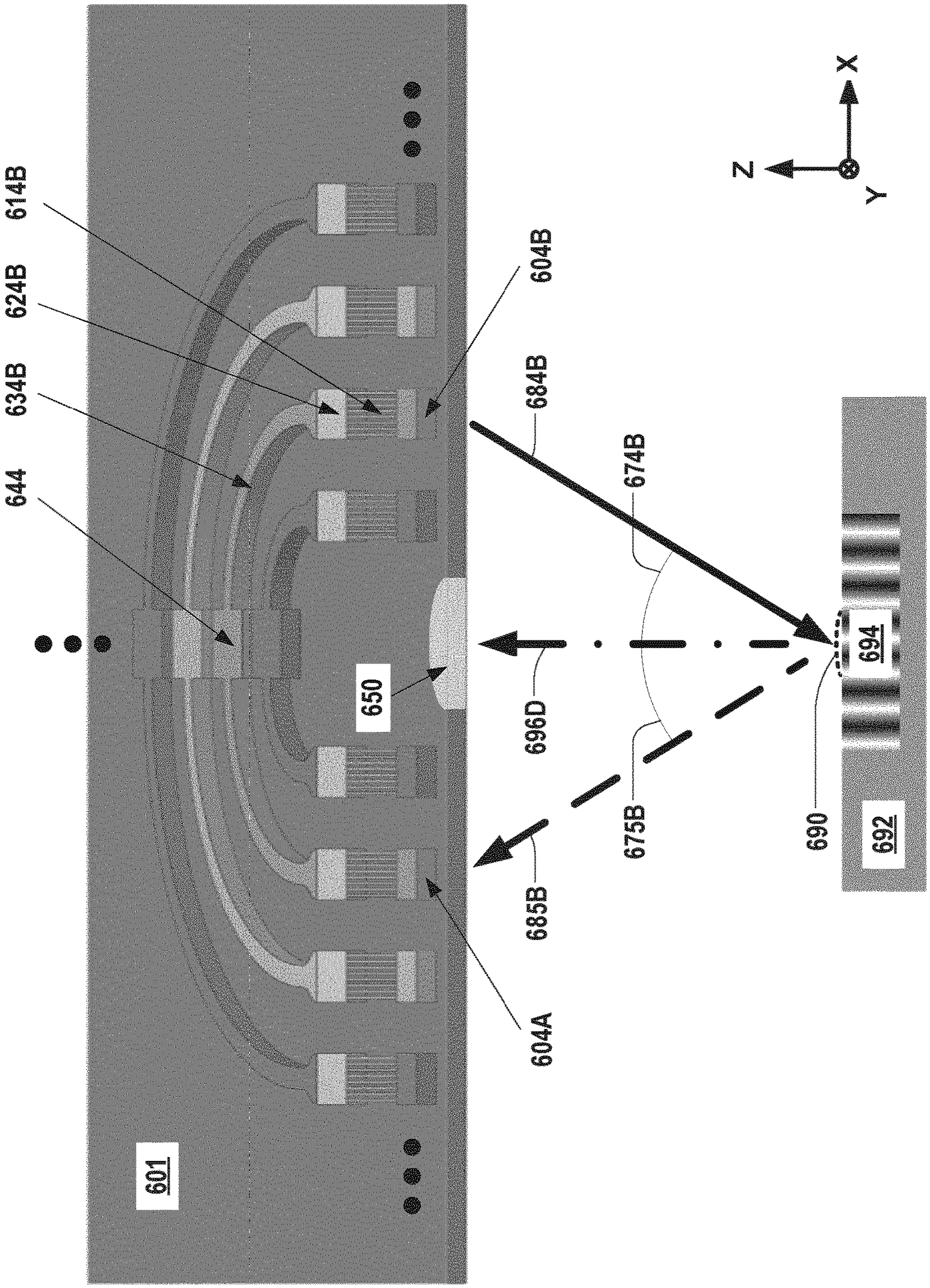

As shown in FIGS. 6D and 6E, in some aspects, the plurality of off-axis illumination subsystems can further include the third off-axis illumination subsystem that includes the emitter 604A, the grating structure 614A, and the phase array 624A. In some aspects, the plurality of off-axis illumination subsystems can further include the fourth off-axis illumination subsystem that includes the emitter 604B, the grating structure 614B, and the phase array 624B. In some aspects, the optical coupler 640 can further include the optical filter structure 644. The optical filter structure 644 can be configured to filter the received multi-wavelength radiation into a stream of photons at a second wavelength (e.g., green light), transmit a second "positive" stream of photons at the second wavelength to the third off-axis illumination subsystem (e.g., to the phase array 624A and then to the grating structure 614A and subsequently to the emitter 604A) via the optical path structure 634A, and transmit a second "negative" stream of photons at the second wavelength to the fourth off-axis illumination subsystem (e.g., to the phase array 624B and then to the grating structure 614B and subsequently to the emitter 604B) via the optical path structure 634B. In some aspects, the second "negative" stream of photons can be the same as the second "positive" stream of photons. In other aspects, the second "negative" stream of photons can be different from the second "positive" stream of photons. For example, the second "negative" stream of photons can be a modified (e.g., rotated by 90 degrees) version of the second "positive" stream of photons.

As shown in FIG. 6D, in some aspects, the third off-axis illumination subsystem can be configured to generate an off-axis radiation beam 684A (e.g., a beam of substantially coherent radiation at the second wavelength) based on the second "positive" stream of photons. In some aspects, the third off-axis illumination subsystem can be further configured to transmit the off-axis radiation beam 684A to the region 690 at an off-axis incident angle 674A.

In some aspects, the detection subsystem can be configured to receive, via the optic 650, an on-axis diffracted radiation beam 696C that includes a set of photons diffracted from the region 690 in response to an illumination of the region 690 by the off-axis radiation beam 684A. In some aspects, the set of photons included in the on-axis diffracted radiation beam 696C can be indicative of first-order diffraction in response to the illumination of the region 690 by the off-axis radiation beam 684A.

In some aspects, the emitter 604B can be configured to receive an off-axis diffracted radiation beam 685A that includes a set of photons diffracted from the region 690 at an off-axis diffraction angle 675A in response to the illumination of the region 690 by the off-axis radiation beam 684A. In some aspects, the set of photons included in the off-axis diffracted radiation beam 685A can be indicative of zero-order diffraction in response to the illumination of the region 690 by the off-axis radiation beam 684A.

In some aspects, the off-axis incident angle 674A and the off-axis diffraction angle 675A can be defined relative to the surface normal of the surface of the substrate 692. In some aspects, the magnitude of the off-axis incident angle 674A can be about the same as (e.g., about equal to) the magnitude of the off-axis diffraction angle 675A. In some aspects, the on-axis diffracted radiation beam 696C can be coincident with the surface normal (e.g., the angle between the on-axis diffracted radiation beam 696C and the surface normal can be about zero). In other aspects, the on-axis diffracted radiation beam 696C can be non-coincident with the surface normal (e.g., the angle between the on-axis diffracted radiation beam 696C and the surface normal can be non-zero).

As shown in FIG. 6E, in some aspects, the fourth off-axis illumination subsystem can be configured to generate an off-axis radiation beam 684B (e.g., a beam of substantially coherent radiation at the second wavelength) based on the second "negative" stream of photons. In some aspects, the fourth off-axis illumination subsystem can be further configured to transmit the off-axis radiation beam 684B to the region 690 at an off-axis incident angle 674B.

In some aspects, the detection subsystem can be configured to receive, via the optic 650, an on-axis diffracted radiation beam 696D that includes a set of photons diffracted from the region 690 in response to an illumination of the region 690 by the off-axis radiation beam 684B. In some aspects, the set of photons included in the on-axis diffracted radiation beam 696D can be indicative of first-order diffraction in response to the illumination of the region 690 by the off-axis radiation beam 684B.

In some aspects, the emitter 604A can be configured to receive an off-axis diffracted radiation beam 685B that includes a set of photons diffracted from the region 690 at an off-axis diffraction angle 675B in response to the illumination of the region 690 by the off-axis radiation beam 684B. In some aspects, the set of photons included in the off-axis diffracted radiation beam 685B can be indicative of zero-order diffraction in response to the illumination of the region 690 by the off-axis radiation beam 684B.

In some aspects, the off-axis incident angle 674B and the off-axis diffraction angle 675B can be defined relative to the surface normal of the surface of the substrate 692. In some aspects, the magnitude of the off-axis incident angle 674B can be about the same as (e.g., about equal to) the magnitude of the off-axis diffraction angle 675B. In some aspects, the on-axis diffracted radiation beam 696D can be coincident with the surface normal (e.g., the angle between the on-axis diffracted radiation beam 696D and the surface normal can be about zero). In other aspects, the on-axis diffracted radiation beam 696D can be non-coincident with the surface normal (e.g., the angle between the on-axis diffracted radiation beam 696D and the surface normal can be non-zero).

Figure 6F:
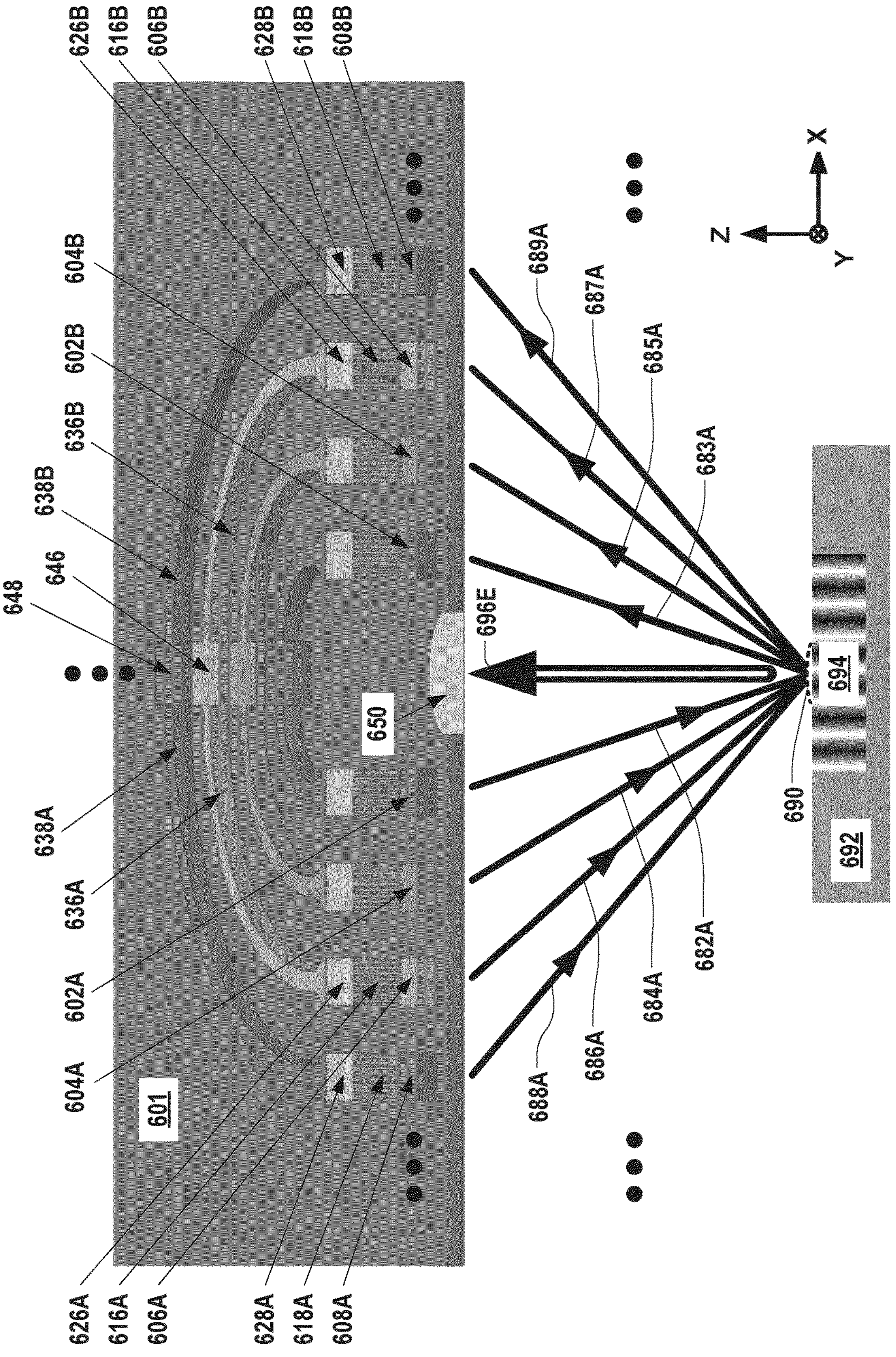
Figure 6G:
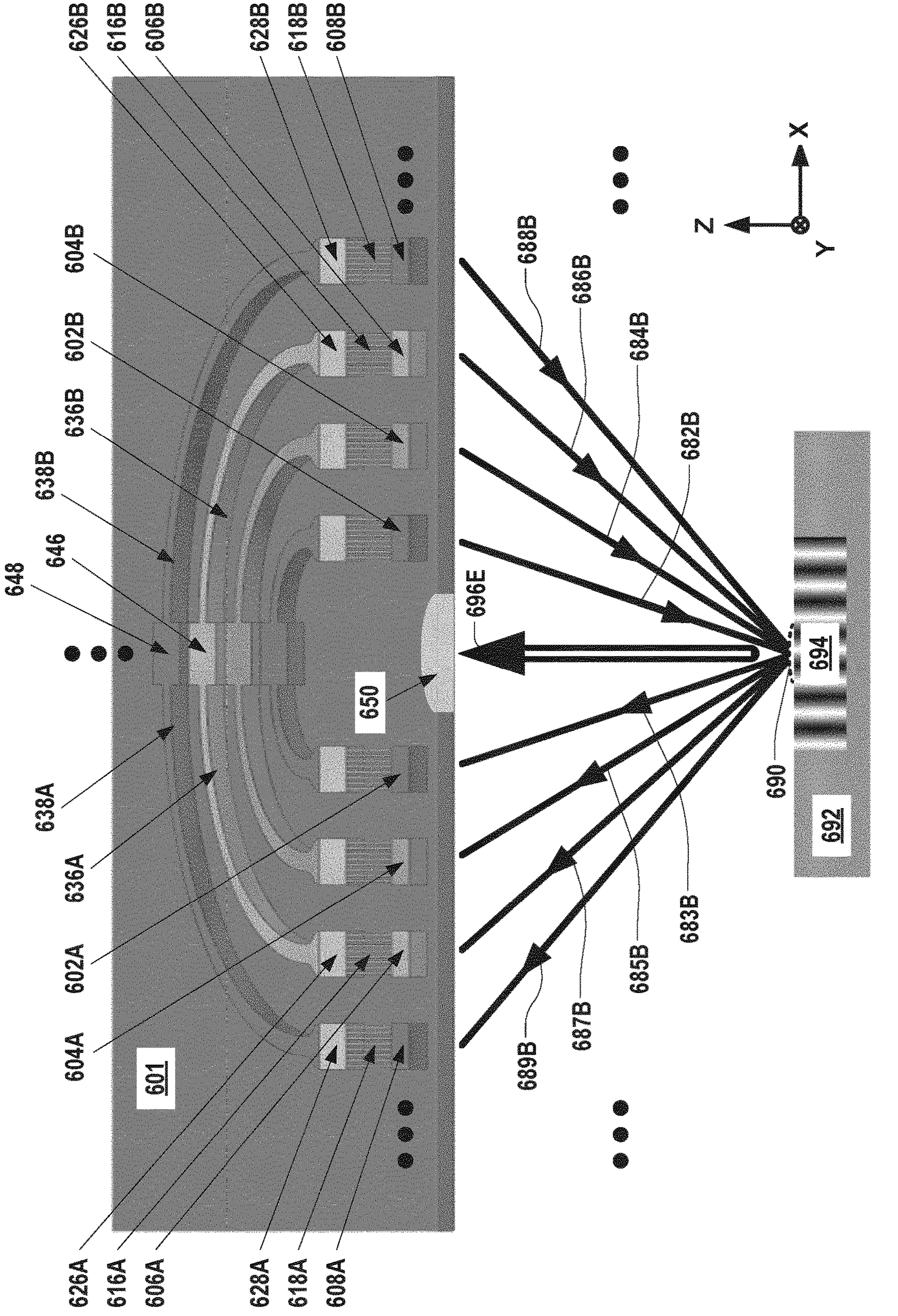

As shown in FIGS. 6F and 6G, in some aspects, the plurality of off-axis illumination subsystems can further include the fifth off-axis illumination subsystem that includes the emitter 606A, the grating structure 616A, and the phase array 626A. In some aspects, the plurality of off-axis illumination subsystems can further include the sixth off-axis illumination subsystem that includes the emitter 606B, the grating structure 616B, and the phase array 626B. In some aspects, the optical coupler 640 can further include the optical filter structure 646. The optical filter structure 646 can be configured to filter the received multi-wavelength radiation into a stream of photons at a third wavelength (e.g., orange light), transmit a third "positive" stream of photons at the third wavelength to the fifth off-axis illumination subsystem (e.g., to the phase array 626A and then to the grating structure 616A and subsequently to the emitter 606A) via the optical path structure 636A, and transmit a third "negative" stream of photons at the third wavelength to the sixth off-axis illumination subsystem (e.g., to the phase array 626B and then to the grating structure 616B and subsequently to the emitter 606B) via the optical path structure 636B. In some aspects, the third "negative" stream of photons can be the same as the third "positive" stream of photons. In other aspects, the third "negative" stream of photons can be different from the third "positive" stream of photons. For example, the third "negative" stream of photons can be a modified (e.g., rotated by 90 degrees) version of the third "positive" stream of photons. In some aspects, the fifth off-axis illumination subsystem can be configured to generate an off-axis radiation beam

686A (e.g., a beam of substantially coherent radiation at the third wavelength) based on the third "positive" stream of photons. In some aspects, the sixth off-axis illumination subsystem can be configured to generate an off-axis radiation beam 686B (e.g., a beam of substantially coherent radiation at the third wavelength) based on the third "negative" stream of photons.

In some aspects, the plurality of off-axis illumination subsystems can further include the seventh off-axis illumination subsystem that includes the emitter 608A, the grating structure 618A, and the phase array 628A. In some aspects, the plurality of off-axis illumination subsystems can further include the eighth off-axis illumination subsystem that includes the emitter 608B, the grating structure 618B, and the phase array 628B. In some aspects, the optical coupler 640 can further include the optical filter structure 648. The optical filter structure 648 can be configured to filter the received multi-wavelength radiation into a stream of photons at a fourth wavelength (e.g., red light), transmit a fourth "positive" stream of photons at the fourth wavelength to the seventh off-axis illumination subsystem (e.g., to the phase array 628A and then to the grating structure 618A and subsequently to the emitter 608A) via the optical path structure 638A, and transmit a fourth "negative" stream of photons at the fourth wavelength to the eighth off-axis illumination subsystem (e.g., to the phase array 628B and then to the grating structure 618B and subsequently to the emitter 608B) via the optical path structure 638B. In some aspects, the fourth "negative" stream of photons can be the same as the fourth "positive" stream of photons. In other aspects, the fourth "negative" stream of photons can be different from the fourth "positive" stream of photons. For example, the fourth "negative" stream of photons can be a modified (e.g., rotated by 90 degrees) version of the fourth "positive" stream of photons. In some aspects, the seventh off-axis illumination subsystem can be configured to generate an off-axis radiation beam 688A (e.g., a beam of substantially coherent radiation at the fourth wavelength) based on the fourth "positive" stream of photons. In some aspects, the eighth off-axis illumination subsystem can be configured to generate an off-axis radiation beam 688B (e.g., a beam of substantially coherent radiation at the fourth wavelength) based on the fourth "negative" stream of photons.

As shown in FIG. 6F, in some aspects, the first off-axis illumination subsystem can be further configured to transmit the off-axis radiation beam 682A to the region 690 at a first off-axis incident angle. In some aspects, the third off-axis illumination subsystem can be further configured to transmit the off-axis radiation beam 684A to the region 690 at a third off-axis incident angle. In some aspects, the fifth off-axis illumination subsystem can be further configured to transmit the off-axis radiation beam 686A to the region 690 at a fifth off-axis incident angle. In some aspects, the seventh off-axis illumination subsystem can be further configured to transmit the off-axis radiation beam 688A to the region 690 at a seventh off-axis incident angle.

In some aspects, the detection subsystem can be configured to receive, via the optic 650 along the on-axis diffracted radiation beam path 696E, a first on-axis diffracted radiation beam indicative of first-order diffraction that includes a first set of photons diffracted from the region 690 in response to an illumination of the region 690 by the off-axis radiation beam 682A. In some aspects, the detection subsystem can be configured to receive, via the optic 650 along the on-axis diffracted radiation beam path 696E, a third on-axis diffracted radiation beam indicative of first-order diffraction that includes a third set of photons diffracted from the region 690 in response to an illumination of the region 690 by the off-axis radiation beam 684A. In some aspects, the detection subsystem can be configured to receive, via the optic 650 along the on-axis diffracted radiation beam path 696E, a fifth on-axis diffracted radiation beam indicative of first-order diffraction that includes a fifth set of photons diffracted from the region 690 in response to an illumination of the region 690 by the off-axis radiation beam 686A. In some aspects, the detection subsystem can be configured to receive, via the optic 650 along the on-axis diffracted radiation beam path 696E, a seventh on-axis diffracted radiation beam indicative of first-order diffraction that includes a seventh set of photons diffracted from the region 690 in response to an illumination of the region 690 by the off-axis radiation beam 688A.

In some aspects, the emitter 602B can be configured to receive an off-axis diffracted radiation beam 683A indicative of zero-order diffraction that includes a ninth set of photons diffracted from the region 690 at a ninth diffraction angle in response to the illumination of the region 690 by the off-axis radiation beam 682A. In some aspects, the emitter 604B can be configured to receive an off-axis diffracted radiation beam 685A indicative of zero-order diffraction that includes an eleventh set of photons diffracted from the region 690 at an eleventh diffraction angle in response to the illumination of the region 690 by the off-axis radiation beam 684A. In some aspects, the emitter 606B can be configured to receive an off-axis diffracted radiation beam 687A indicative of zero-order diffraction that includes a thirteenth set of photons diffracted from the region 690 at a thirteenth diffraction angle in response to the illumination of the region 690 by the off-axis radiation beam 686A. In some aspects, the emitter 608B can be configured to receive an off-axis diffracted radiation beam 689A indicative of zero-order diffraction that includes a fifteenth set of photons diffracted from the region 690 at a fifteenth diffraction angle in response to the illumination of the region 690 by the off-axis radiation beam 688A.

As shown in FIG. 6G, in some aspects, the second off-axis illumination subsystem can be further configured to transmit the off-axis radiation beam 682B to the region 690 at a second off-axis incident angle. In some aspects, the fourth off-axis illumination subsystem can be further configured to transmit the off-axis radiation beam 684B to the region 690 at a fourth off-axis incident angle. In some aspects, the sixth off-axis illumination subsystem can be further configured to transmit the off-axis radiation beam 686B to the region 690 at a sixth off-axis incident angle. In some aspects, the eighth off-axis illumination subsystem can be further configured to transmit the off-axis radiation beam 688B to the region 690 at an eighth off-axis incident angle.

In some aspects, the detection subsystem can be configured to receive, via the optic 650 along the on-axis diffracted radiation beam path 696E, a second on-axis diffracted radiation beam indicative of first-order diffraction that includes a second set of photons diffracted from the region 690 in response to an illumination of the region 690 by the off-axis radiation beam 682B. In some aspects, the detection subsystem can be configured to receive, via the optic 650 along the on-axis diffracted radiation beam path 696E, a fourth on-axis diffracted radiation beam indicative of first-order diffraction that includes a fourth set of photons diffracted from the region 690 in response to an illumination of the region 690 by the off-axis radiation beam 684B. In some aspects, the detection subsystem can be configured to receive, via the optic 650 along the on-axis diffracted radiation beam path 696E, a sixth on-axis diffracted radiation beam indicative of first-order diffraction that includes a sixth set of photons diffracted from the region 690 in response to an illumination of the region 690 by the off-axis radiation beam 686B. In some aspects, the detection subsystem can be configured to receive, via the optic 650 along the on-axis diffracted radiation beam path 696E, an eighth on-axis diffracted radiation beam indicative of first-order diffraction that includes an eighth set of photons diffracted from the region 690 in response to an illumination of the region 690 by the off-axis radiation beam 688B.

In some aspects, the emitter 602A can be configured to receive an off-axis diffracted radiation beam 683B indicative of zero-order diffraction that includes a tenth set of photons diffracted from the region 690 at a tenth diffraction angle in response to the illumination of the region 690 by the off-axis radiation beam 682B. In some aspects, the emitter 604A can be configured to receive an off-axis diffracted radiation beam 685B indicative of zero-order diffraction that includes a twelfth set of photons diffracted from the region 690 at a twelfth diffraction angle in response to the illumination of the region 690 by the off-axis radiation beam 684B. In some aspects, the emitter 606A can be configured to receive an off-axis diffracted radiation beam 687B indicative of zero-order diffraction that includes a fourteenth set of photons diffracted from the region 690 at a fourteenth diffraction angle in response to the illumination of the region 690 by the off-axis radiation beam 686B. In some aspects, the emitter 608A can be configured to receive an off-axis diffracted radiation beam 689B indicative of zero-order diffraction that includes a sixteenth set of photons diffracted from the region 690 at a sixteenth diffraction angle in response to the illumination of the region 690 by the off-axis radiation beam 688B.

Referring now to FIGS. 6F and 6G, in some aspects, the off-axis radiation beams 682A, 682B, 684A, 684B, 686A, 686B, 688A, and 688B can be transmitted to, or incident on, the region 690 at substantially the same time. In some aspects, the off-axis radiation beams 682A, 682B, 684A, 684B, 686A, 686B, 688A, and 688B can be transmitted to, or incident on, the region 690 at substantially different times. In some aspects, the detection subsystem can be configured to receive, via the optic 650 along the on-axis diffracted radiation beam path 696E, one or more of the first on-axis diffracted radiation beam, the second on-axis diffracted radiation beam, the third on-axis diffracted radiation beam, the fourth on-axis diffracted radiation beam, the fifth on-axis diffracted radiation beam, the sixth on-axis diffracted radiation beam, the seventh on-axis diffracted radiation beam, and the eight on-axis diffracted radiation beam at substantially the same time. In some aspects, the detection subsystem can be configured to receive, via the optic 650 along the on-axis diffracted radiation beam path 696E, one or more of the first on-axis diffracted radiation beam, the second on-axis diffracted radiation beam, the third on-axis diffracted radiation beam, the fourth on-axis diffracted radiation beam, the fifth on-axis diffracted radiation beam, the sixth on-axis diffracted radiation beam, the seventh on-axis diffracted radiation beam, and the eight on-axis diffracted radiation beam at substantially different times.

In one illustrative and non-limiting example, the off-axis radiation beams 682A and 682B can be transmitted to, or incident on, the region 690 at substantially a first time; the off-axis radiation beams 684A and 684B can be transmitted to, or incident on, the region 690 at substantially a second time (e.g., after the first time); the off-axis radiation beams 686A and 686B can be transmitted to, or incident on, the region 690 at substantially a third time (e.g., after the second time); and the off-axis radiation beams 688A and 688B can be transmitted to, or incident on, the region 690 at substantially a fourth time (e.g., after the third time). Continuing this illustrative and non-limiting example, the detection subsystem can be configured to receive, via the optic 650 along the on-axis diffracted radiation beam path 696E: the first on-axis diffracted radiation beam and the second on-axis diffracted radiation beam at substantially a fifth time (e.g., after the first time referred to above with reference to the off-axis radiation beams 682A and 682B); the third on-axis diffracted radiation beam and the fourth on-axis diffracted radiation beam at substantially a sixth time (e.g., after the fifth time); the fifth on-axis diffracted radiation beam and the sixth on-axis diffracted radiation beam at substantially a seventh time (e.g., after the sixth time); and the seventh on-axis diffracted radiation beam and the eight on-axis diffracted radiation beam at substantially an eighth time (e.g., after the seventh time).

In another illustrative and non-limiting example, the off-axis radiation beams 682A, 684A, 686A, and 688A can be transmitted to, or incident on, the region 690 at substantially a ninth time (e.g., unrelated to the first through eighth times described above); and the off-axis radiation beams 682B, 684B, 686B, and 688B can be transmitted to, or incident on, the region 690 at substantially a tenth time (e.g., after the ninth time). Continuing this illustrative and non-limiting example, the detection subsystem can be configured to receive, via the optic 650 along the on-axis diffracted radiation beam path 696E: the first, third, fifth, and seventh on-axis diffracted radiation beams at substantially an eleventh time (e.g., after the ninth time referred to above with reference to the off-axis radiation beams 682A, 684A, 686A, and 688A); and the second, fourth, sixth, and eighth on-axis diffracted radiation beams at substantially a twelfth time (e.g., after the eleventh time).

In some aspects, each of the off-axis incident angles and diffraction angles describe with reference to FIGS. 6F and 6G can be defined relative to the surface normal of the surface of the substrate 692. In some aspects, the on-axis diffracted radiation beam path 696E can be coincident with the surface normal (e.g., the angle between the on-axis diffracted radiation beam path 696E and the surface normal can be about zero). In other aspects, the on-axis diffracted radiation beam path 696E can be non-coincident with the surface normal (e.g., the angle between the on-axis diffracted radiation beam path 696E and the surface normal can be non-zero).

In some aspects, the detection subsystem can be further configured to generate an electronic signal based on the first on-axis diffracted radiation beam; the second on-axis diffracted radiation beam; the third on-axis diffracted radiation beam; the fourth on-axis diffracted radiation beam; the fifth on-axis diffracted radiation beam; the sixth on-axis diffracted radiation beam; the seventh on-axis diffracted radiation beam; the eighth on-axis diffracted radiation beam; any other suitable off-axis radiation beam, set of photons, signals (including, but not limited to sub-signals indicative of an imbalances (e.g., intensity differences, phase differences, or both) between off-axis radiation beams), data, or electronic information; or any combination thereof or any combination thereof. In some aspects, the electronic signal can include: a first sub-signal indicative of an imbalance between the first on-axis diffracted radiation beam and the second on-axis diffracted radiation beam; a second sub-signal indicative of an imbalance between the third on-axis diffracted radiation beam and the fourth on-axis diffracted radiation beam; a third sub-signal indicative of an imbalance between the fifth on-axis diffracted radiation beam and the sixth on-axis diffracted radiation beam; a fourth sub-signal indicative of an imbalance between the seventh on-axis diffracted radiation beam and the eighth on-axis diffracted radiation beam; any other suitable signal, data, or electronic information; or any combination thereof.

Additionally or alternatively, in some aspects, the detection subsystem can be configured to generate the electronic signal based on the off-axis diffracted radiation beams 683A, 683B, 685A, 685B, 687A, 687B, 689A, and 689B; any other suitable off-axis radiation beam, set of photons, signals (including, but not limited to sub-signals indicative of imbalances between off-axis radiation beams), data, or electronic information; or any combination thereof or any combination thereof. In some aspects, the electronic signal can further include: a fifth sub-signal indicative of an intensity difference between the off-axis diffracted radiation beams 683A and 683B; a sixth sub-signal indicative of an intensity difference between the off-axis diffracted radiation beams 685A and 685B; a seventh sub-signal indicative of an intensity difference between the off-axis diffracted radiation beams 687A and 687B; an eighth sub-signal indicative of an intensity difference between the off-axis diffracted radiation beams 689A and 689B; any other suitable signal, data, or electronic information; or any combination thereof. In some aspects, the detection subsystem can be further configured to determine a correction to a determined alignment position of the alignment grating structure 694 based on the electronic signal, any other suitable signal or data, or any portion (e.g., sub-signal) or combination of portions thereof.

Figure 7:
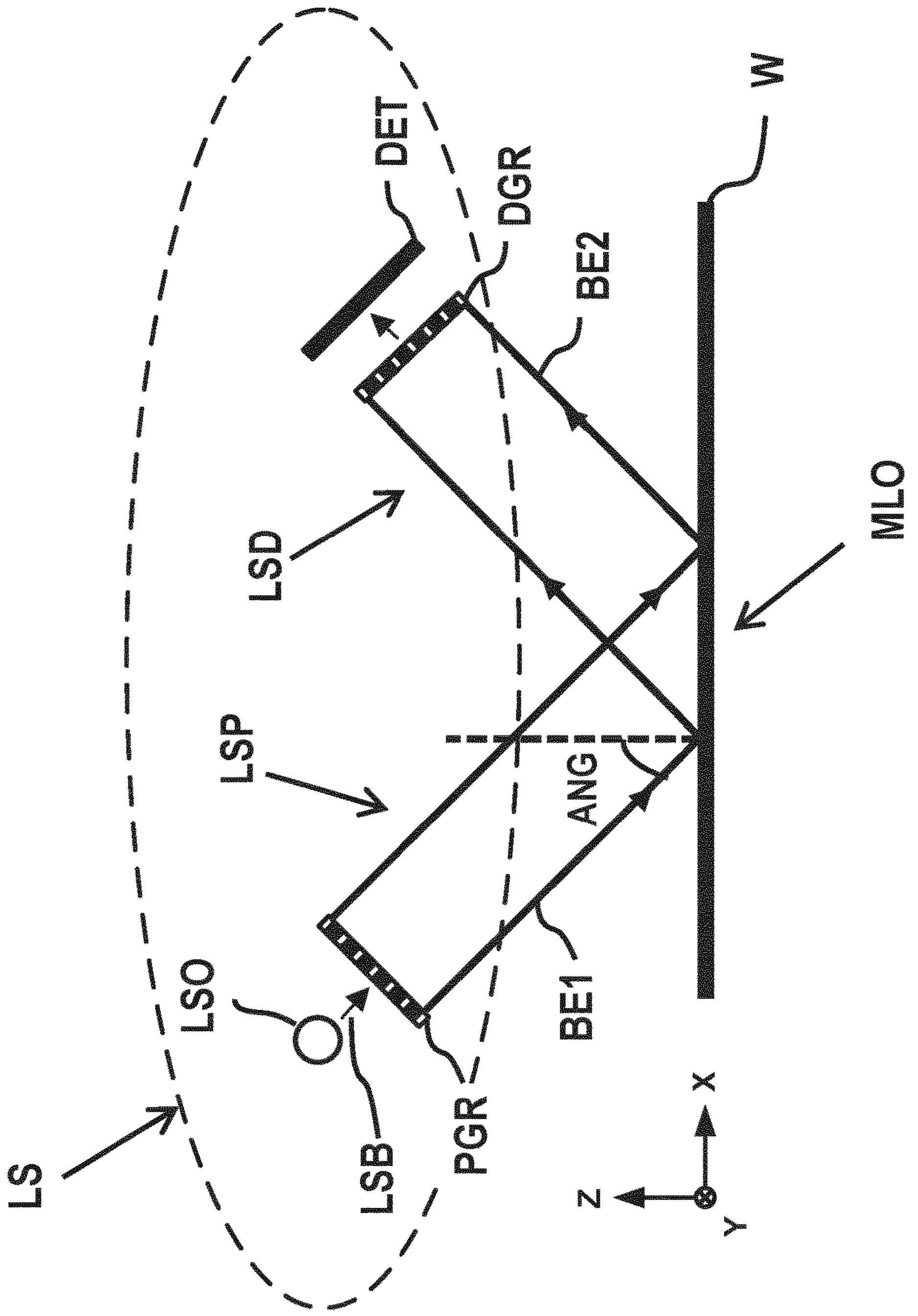
FIG. 7 is a schematic illustration of another example metrology system according to some aspects of the present disclosure.

FIG. 7 shows an example metrology system 700 including an example level sensor LS for an example lithographic apparatus (e.g., lithographic apparatus 100 of FIG. 1A, lithographic apparatus 100' of FIG. 1B) according to some aspects of the present disclosure. As shown in FIG. 7, the example level sensor LS is illustrated from a point of view (e.g., a side view) that is normal to the XZ plane. It is to be understood that FIG. 7 illustrates only the principles of operation of the example level sensor LS.

As shown in FIG. 7, the example level sensor LS includes an optical system that includes a projection unit LSP and a detection unit LSD. The projection unit LSP includes a radiation source LSO providing a radiation beam LSB, which is imparted by a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. In some aspects, the radiation source LSO may include a plurality of radiation sources having different colors, or wavelength ranges, such as a plurality of LEDs. The radiation source LSO of the example level sensor LS is not restricted to visible radiation, but in some aspects may additionally or alternatively encompass UV and/or IR radiation and any range of wavelengths suitable to reflect from a surface of a substrate W or from a layer at the substrate W.

In some aspects, the projection grating PGR can be a grating including, for example, a periodic structure resulting in a patterned radiation beam BE1 having a periodically varying intensity. The patterned radiation beam BE1 can be directed towards a measurement location MLO on a substrate W having an angle of incidence ANG with respect to an axis (e.g., the Z-axis) perpendicular to the incident substrate surface between 0 degrees and 90 degrees, and in some aspects between 70 degrees and 80 degrees. At the measurement location MLO, the patterned radiation beam BE1 can be reflected by the substrate W and directed towards the detection unit LSD as indicated by reflected patterned radiation beam BE2 (e.g., a radiation beam reflected or refracted, partially or wholly, from the surface of the wafer W in response to illumination of the measurement location MLO by the patterned radiation beam BE1).

In some aspects, in order to determine the height level at the measurement location MLO, the example level sensor LS can further include a detection unit LSD including a detection grating DGR, a detector DET (e.g., a photodetector, a camera), and a computing system (e.g., example computing system 1100 shown in FIG. 11) for processing an output signal of the detector DET. In some aspects, the structure of the detection grating DGR can be identical to the structure of the projection grating PGR. In some aspects, the detector DET can generate a detector output signal indicative of the intensity of the light received or representative of a spatial distribution of the intensity received. The detector DET can include any combination of one or more detector types, such as photodetectors, imaging devices, cameras, interferometers, or other suitable devices, structures, or combinations thereof.

In some aspects, by means of triangulation techniques, the computing system can determine the height level at the measurement location MLO. The detected height level can be related to the signal strength as measured by the detector DET. In some aspects, the signal strength can have a periodicity that depends, in part, on the design of the projection grating PGR and the angle of incidence ANG (e.g., oblique).

In some aspects (not shown in FIG. 7 for the sake of brevity), the projection unit LSP and/or the detection unit LSD can include one or more optical structures, such as lenses, prisms, mirrors, beamsplitters (e.g., polarizing beamsplitters), polarizers, polarization rotators, optical crystals (e.g., non-linear optical crystals), wave plates, windows, and gratings, disposed along the path of the patterned radiation beam BE1 and the reflected patterned beam BE2 between the projection grating PGR and the detection grating DGR.

In some aspects, the detection grating DGR can be omitted, and the detector DET can be placed at the position where the detection grating DGR is located. Such a configuration can provide, in some aspects, a more direct detection of the image of the projection grating PGR. In some aspects, in order to cover the surface of the substrate W effectively, the example level sensor LS can be configured to project an array of measurement beams BE1 onto the surface of the substrate W, thereby generating an array of measurement areas MLO or spots covering a larger measurement range.

Various example height sensors are disclosed in, for example, U.S. Pat. No. 7,265,364, issued Sep. 4, 2007, and titled "Level sensor for lithographic apparatus," and U.S. Pat. No. 7,646,471, issued Jan. 12, 2010, and titled "Lithographic apparatus, level sensor, method of inspection, device manufacturing method, and device manufactured thereby," each of which is incorporated by reference herein in its entirety. An example height sensor using UV radiation instead of visible or infrared radiation is disclosed in, for example, U.S. Pat. No. 8,842,293, issued Sep. 23, 2014, and titled "Level sensor arrangement for lithographic apparatus and device manufacturing method," which is incorporated by reference herein in its entirety. An example compact height sensor which uses a multi-element detector to detect and recognize the position of a grating image without needing a detection grating is disclosed in, for example, U.S. Pat. No. 10,241,425, issued Mar. 26, 2019, and titled "Level sensor, lithographic apparatus and device manufacturing method," which is incorporated by reference herein in its entirety.

Figure 8:
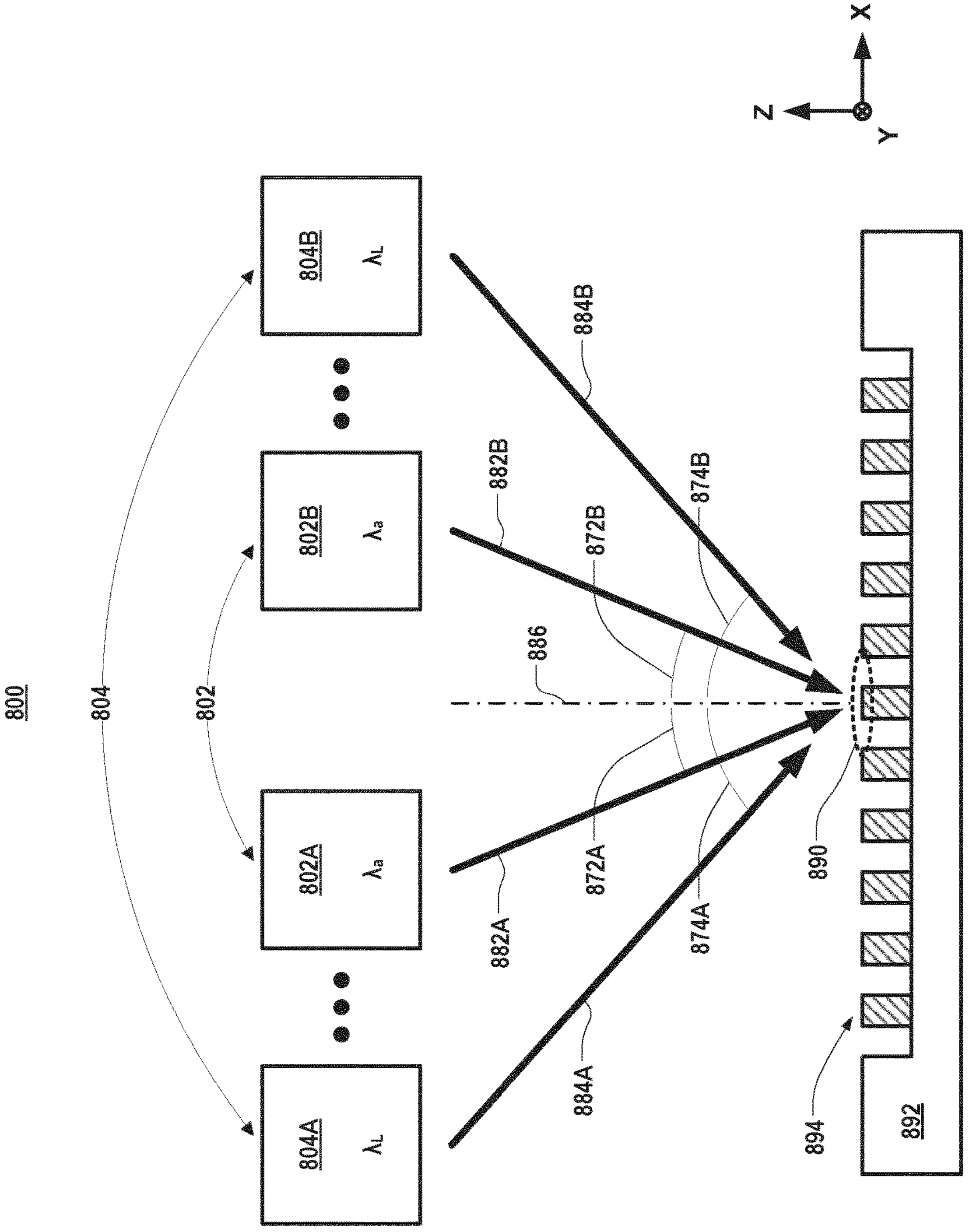
FIG. 8 is a schematic illustration of another example metrology system according to some aspects of the present disclosure.

FIG. 8 is a schematic illustration of an example metrology system 800 according to some aspects of the present disclosure. In some aspects, the example metrology system 800, or any portion thereof, can be implemented using any of the structures, components, features, or techniques described with reference to the example metrology system 400 described with reference to FIGS. 4A and 4B; the example metrology system 500 described with reference to FIG. 5; the example metrology system 600 described with reference to FIGS. 6A, 6B, 6C, 6D, 6E, 6F, and 6G; the example metrology system 700 described with reference to FIG. 7; the example metrology system 900 described with reference to FIG. 9; the example metrology system 1000 described with reference to FIG. 10; the example computing system 1200 described with reference to FIG. 12; any other suitable structure, component, feature, or technique; any portion thereof; or any combination thereof.

As shown in FIG. 8, the example metrology system 800 can include an alignment and/or metrology illumination system 802 and a level sensor illumination system 804. In some aspects, each wavelength band utilized by the example metrology system 800 can have its own illuminator with its own incident angle (e.g., relative to the surface normal 886) to ensure that all of the illuminators illuminate the substrate 892 at the same location (e.g., region 890). In some aspects, the example metrology system 800 can integrate laser sources, phase shifters, light emitters, attenuators, and an electronic circuit for phase control. In some aspects, the example metrology system 800 can enable faster alignment measurements and exploit smaller alignment marks using parallel measurements based on smaller illuminators.

The alignment and/or metrology illumination system 802 can include a plurality of alignment or metrology illuminators, such as alignment illuminators 802A and 802B, configured to illuminate a region 890 of a surface of a substrate 892 with a first radiation beam 882A at a first incident angle 872A and a second radiation beam 882B at a second incident angle 872B. In some aspects, the first radiation beam 882A and the second radiation beam 882B can both have a wavelength $\lambda_a$. In some aspects, the example metrology system 800 can generate a level signal based on radiation diffracted from the region 890 in response to illuminating the region 890 with the first radiation beam 882A and the second radiation beam 882B.

The level sensor illumination system 804 can include a plurality of level sensor illuminators, such as level sensor illuminators 804A and 804B, configured to illuminate the region 890 of the surface of a substrate 892 with a third radiation beam 884A at a third incident angle 874A and a fourth radiation beam 884B at a fourth incident angle 874B. In some aspects, the third radiation beam 884A and the fourth radiation beam 884B can both have a wavelength $\lambda_L$. In some aspects, the example metrology system 800 can generate an alignment signal based on radiation diffracted from the region 890 in response to illuminating the region 890 with the third radiation beam 884A and the fourth radiation beam 884B.

In one illustrative and nonlimiting example, the example metrology system 800 can include a demux to split the polarization and the wavelength into different single mode waveguides. These waveguides can then be branched to multiple waveguides with a phase modulator connected to each one of the branched waveguides. The branched array of waveguides can then be connected with an omni direction emitter, which can be a waveguide facet or a reflecting mirror or gratings. The emerging light can then be directed to illuminate the substrate 892 at the region 890 (e.g., a focused spot). Subsequently, the zero-order reflected beam can be collected by the second phase array which works on the receiving mode.

Figure 9:
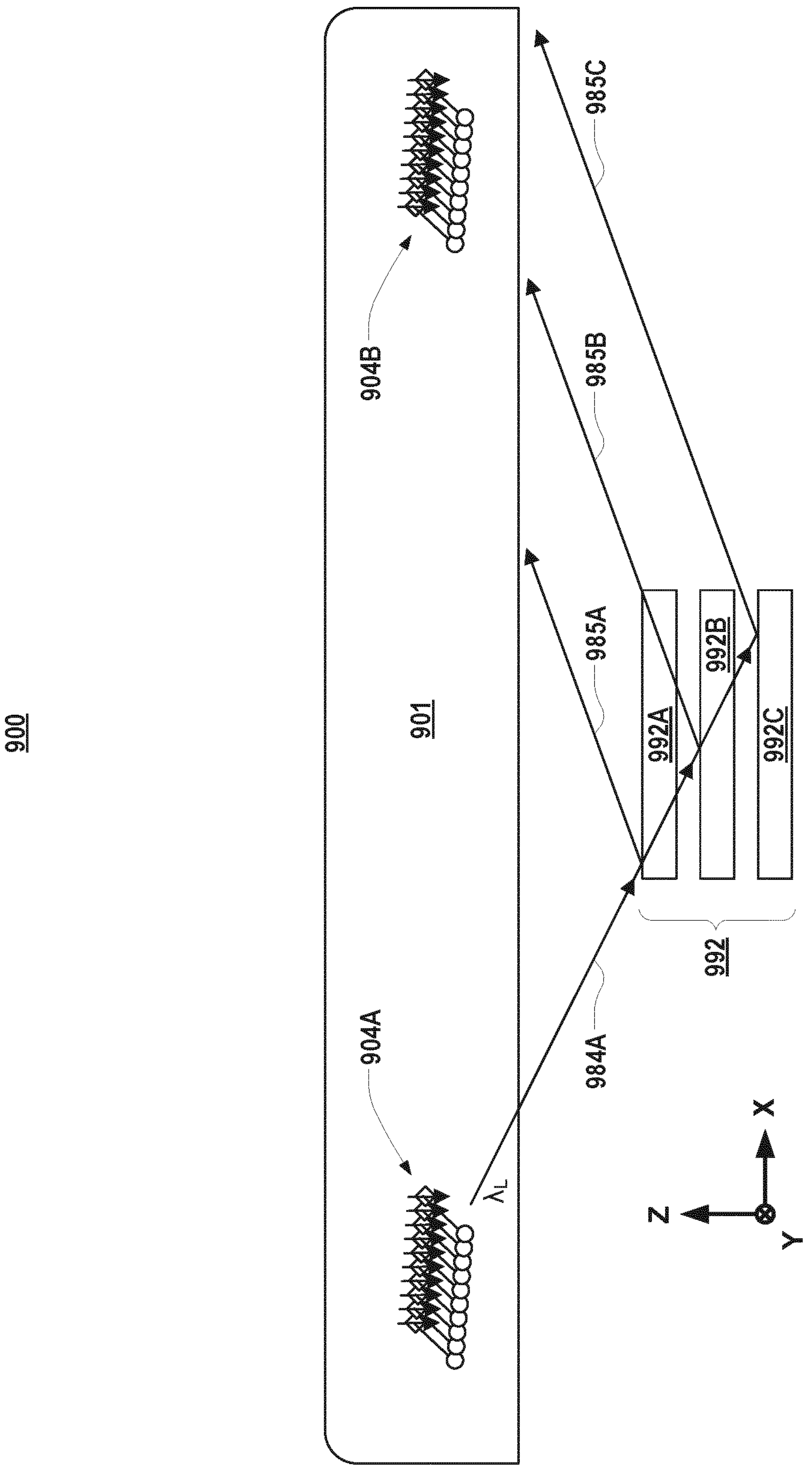
FIG. 9 is a schematic illustration of another example metrology system according to some aspects of the present disclosure.

FIG. 9 is a schematic illustration of an example metrology system 900 according to some aspects of the present disclosure. In some aspects, the example metrology system 900, or any portion thereof, can be implemented using any of the structures, components, features, or techniques described with reference to the example metrology system 400 described with reference to FIGS. 4A and 4B; the example metrology system 500 described with reference to FIG. 5; the example metrology system 600 described with reference to FIGS. 6A, 6B, 6C, 6D, 6E, 6F, and 6G; the example metrology system 700 described with reference to FIG. 7; the example metrology system 800 described with reference to FIG. 8; the example metrology system 1000 described with reference to FIG. 10; the example computing system 1200 described with reference to FIG. 12; any other suitable structure, component, feature, or technique; any portion thereof; or any combination thereof.

As shown in FIG. 9, the example metrology system 900 can include an integrated level sensor chip 901 having a transmission array 904A and a reception array 904B. The transmission array 904A can be configured to illuminate a surface of a substrate 992 with a radiation beam 984A at a wavelength $\lambda_L$. In response, the reception array 904B can be configured to measure radiation diffracted from the surface of the substrate 992. In some aspects, changing the distance between the integrated level sensor chip 901 and the substrate 992 changes the power received by the reception array 904B, where the focusing height gives the highest received power.

In one illustrative and nonlimiting example, the reception array 904B can measure a first diffracted radiation beam 985A when the distance between the integrated level sensor chip 901 and the substrate 992 is as shown by substrate position 992A. The reception array 904B can measure a second diffracted radiation beam 985B when the distance between the integrated level sensor chip 901 and the substrate 992 is as shown by substrate position 992B. The reception array 904B can measure a third diffracted radiation beam 985C when the distance between the integrated level sensor chip 901 and the substrate 992 is as shown by substrate position 992C. The second diffracted radiation beam 985B can have the highest power received by the reception array 904B and thus substrate position 992B can be determined to be the focusing height.

Additionally or alternatively, in some aspects (not depicted), the example metrology system 900 can use frequency modulated continuous wave (FMCW). In such aspects, the transmission array 904A can be a frequency sweeping source, and the reception array 904B can be placed to measure the beating frequency of the transmission array 904A to obtain more accurate measurements for the travelling distance.

Figure 10:
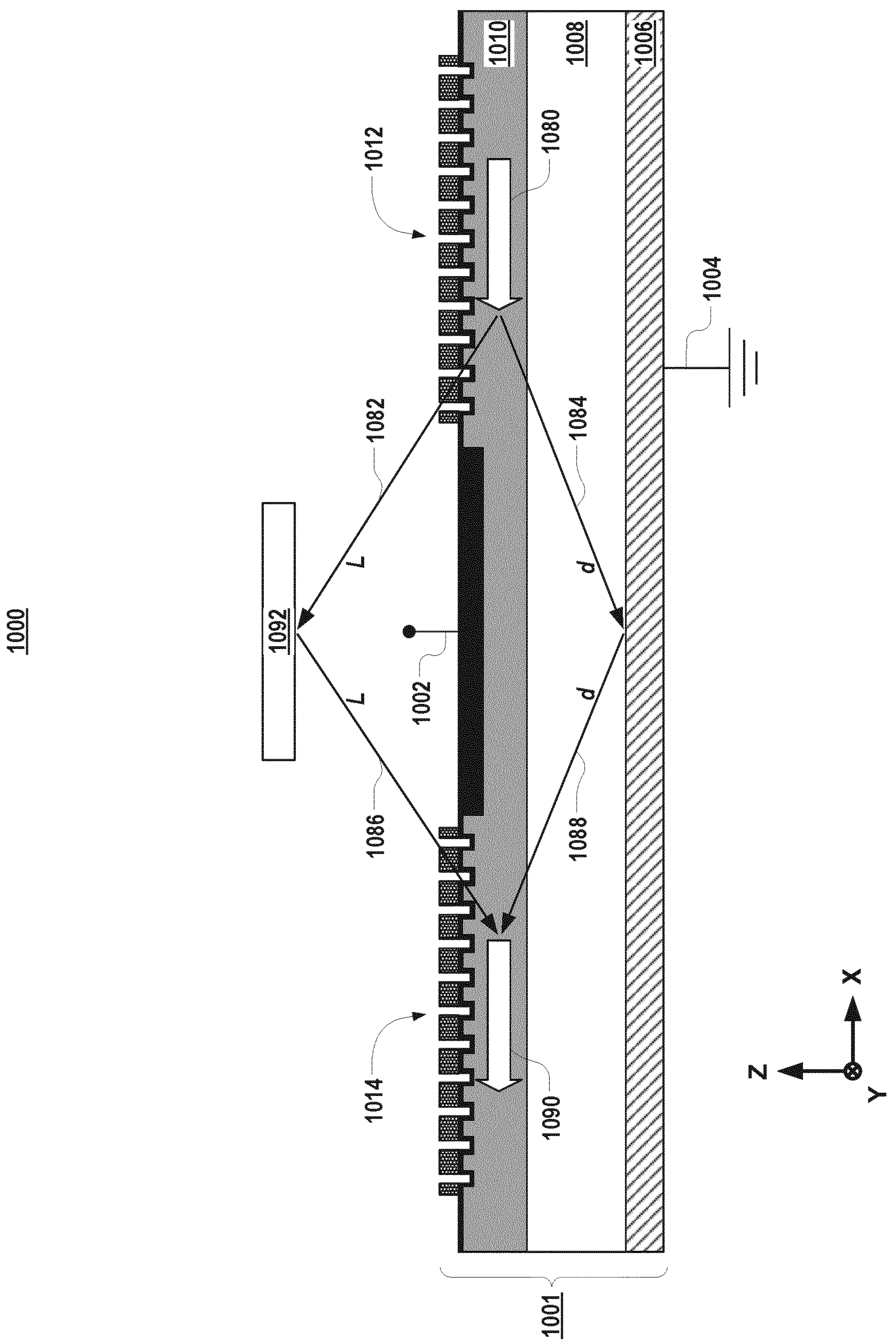
FIG. 10 is a schematic illustration of another example metrology system according to some aspects of the present disclosure.

FIG. 10 is a schematic illustration of an example metrology system 1000 according to some aspects of the present disclosure. In some aspects, the example metrology system 1000, or any portion thereof, can be implemented using any of the structures, components, features, or techniques described with reference to the example metrology system 400 described with reference to FIGS. 4A and 4B; the example metrology system 500 described with reference to FIG. 5; the example metrology system 600 described with reference to FIGS. 6A, 6B, 6C, 6D, 6E, 6F, and 6G; the example metrology system 700 described with reference to FIG. 7; the example metrology system 800 described with reference to FIG. 8; the example metrology system 1000 described with reference to FIG. 10; the example computing system 1200 described with reference to FIG. 12; any other suitable structure, component, feature, or technique; any portion thereof; or any combination thereof.

As shown in FIG. 10, the example metrology system 1000 can include an integrated level sensor chip 1001 having an electrical contact 1002, an electrical grounding 1004, a substrate 1006, a tunable electro-optical layer 1008 (a tunable electro-optical material having a tunable index of refraction n), an optical layer 1010, a first grating waveguide 1012, and a second grating waveguide 1014. The electrical contact 1002 receives an applied voltage to the tunable electro-optical layer 1008, and the electrical grounding 1004 grounds the substrate 1006.

The first grating waveguide 1012 diffracts light as indicated by arrow 1080 to both the positive and negative first diffraction orders as indicated by the diffracted radiation beams 1082 and 1084. The diffracted radiation beam 1082 hits a surface of the substrate 1092 and results in the diffracted radiation beam 1086 traveling to the second grating waveguide 1014. The diffracted radiation beam 1084 hits a surface of the substrate 1006 and results in the diffracted radiation beam 1088 traveling to the second grating waveguide 1014. The second grating waveguide 1014 collects the diffracted radiation beams 1086 and 1088 as indicated by arrow 1090.

In some aspects, the diffracted radiation beam 1084 is used a tunable reference through an electro-optic material in the tunable electro-optical layer 1008 that is controlled by an external voltage source. The change in the voltage can be used to find the maximum received power in the second grating waveguide 1014, and thus the path length and level height can be determined according to equation 1:

$$2L = 2n*d \rightarrow \Delta L = \Delta n*d \quad (1)$$

Where 2L refers to the path length traveled by the diffracted radiation beams 1082 and 1086, n refers to the index of refraction of the tunable electro-optical layer 1008, and 2n*d refers to the path length traveled by the diffracted radiation beams 1084 and 1088.

Example Processes for Measuring Intensity Using Off-Axis Illumination

Figure 11:
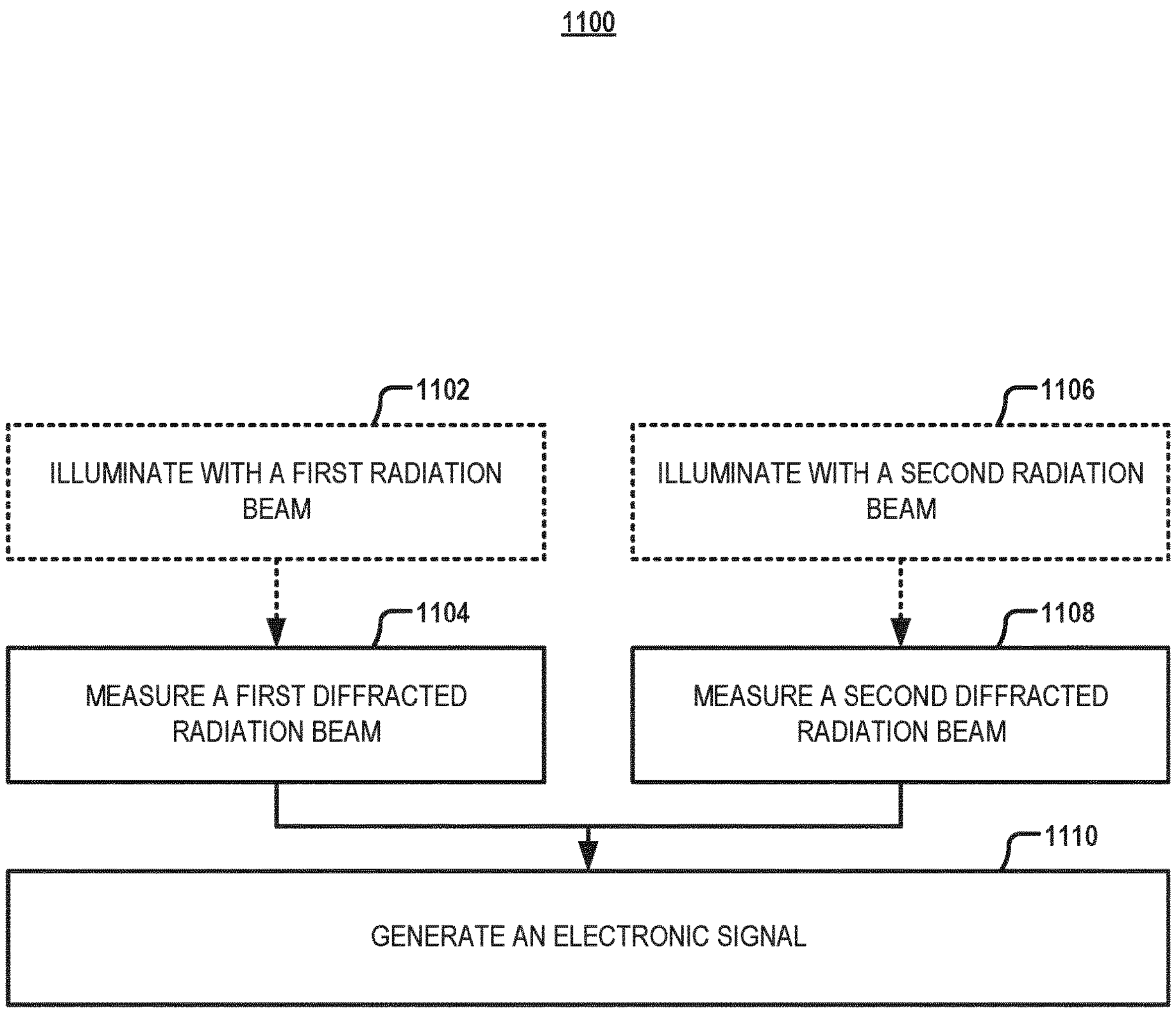
FIG. 11 is an example method for measuring intensity using off-axis illumination according to some aspects of the present disclosure or portion(s) thereof.

FIG. 11 is an example method 1100 for measuring intensity and phase using off-axis illumination according to some aspects of the present disclosure or portion(s) thereof. The operations described with reference to example method 1100 can be performed by, or according to, any of the systems, apparatuses, components, techniques, or combinations thereof described herein, such as those described with reference to FIGS. 1-10 above and FIG. 12 below.

Optionally, at optional operation 1102, the method can include illuminating, by a first illumination system (e.g., by a first off-axis illumination system or subsystem), a region (e.g., region 490, 590, 690) of a surface of a substrate with a first radiation beam at a first incident angle. In some aspects, the first radiation beam can include one of the off-axis radiation beams 482A, 484A, 483B, 485B, 582, 584, 682A, 682B, 684A, 684B, 686A, 686B, 688A, 688B, BE1, 882A, 882B, 884A, 884B, 984A, 1082, 1084, or any other suitable radiation beam or set of photons. In some aspects, the illumination of the region with the first radiation beam can be accomplished using suitable mechanical or other methods and include illuminating the region with the first radiation beam in accordance with any aspect or combination of aspects described with reference to FIGS. 1-10 above and FIG. 12 below.

At operation 1104, the method can include measuring, by a first detection system (e.g., by an on-axis detection system or subsystem, or by a first off-axis detection system or subsystem), a first diffracted radiation beam. The first diffracted radiation beam can include, for example, a first set of photons diffracted from the region in response to the illumination of the region with the first radiation beam at optional operation 1102. In some aspects, the first diffracted radiation beam can include one of: the on-axis diffracted radiation beams propagated along the on-axis diffracted radiation beam path 486 or 696E; the on-axis diffracted radiation beams 596 and 597; the on-axis diffracted radiation beams 696A, 696B, 696C, and 696D; the off-axis diffracted radiation beams 482B, 483A, 484B, and 485A; the off-axis diffracted radiation beams 583 and 585; the off-axis diffracted radiation beams 683A, 683B, 685A, 685B, 687A, 687B, 689A, and 689B; the reflected patterned radiation beam BE2; any diffracted radiation measured by the example metrology system 800; the diffracted radiation beams 985A, 985B, and 985C; the diffracted radiation beams 1086 and 1088; or any other suitable diffracted radiation beam (e.g., zero-order diffraction, +/−first-order diffraction, +/−second-order diffraction, and so forth). In some aspects, the measurement of the first diffracted radiation beam can be accomplished using suitable mechanical or other methods and include measuring the first diffracted radiation beam in accordance with any aspect or combination of aspects described with reference to FIGS. 1-10 above and FIG. 12 below.

Optionally, at optional operation 1106, the method can include illuminating, by a second illumination system (e.g., by a second off-axis illumination system or subsystem), the region with a second radiation beam at a second incident angle. In some aspects, the second radiation beam can include another of the off-axis radiation beams 482A, 484A, 483B, 485B, 582, 584, 682A, 682B, 684A, 684B, 686A, 686B, 688A, 688B, BE1, 882A, 882B, 884A, 884B, 984A, 1082, 1084, or any other suitable radiation beam or set of photons. In some aspects, the illumination of the region with the second radiation beam can be accomplished using suitable mechanical or other methods and include illuminating the region with the second radiation beam in accordance with any aspect or combination of aspects described with reference to FIGS. 1-10 above and FIG. 12 below.

At operation 1108, the method can include measuring, by a second detection system (e.g., by an on-axis detection system or subsystem, or by a second off-axis detection system or subsystem), a second diffracted radiation beam. The second diffracted radiation beam can include, for example, a second set of photons diffracted from the region in response to the illumination of the region with the second radiation beam at optional operation 1108. In some aspects, the second diffracted radiation beam can include another of: the on-axis diffracted radiation beams propagated along the on-axis diffracted radiation beam path 486 or 696E; the on-axis diffracted radiation beams 596 and 597; the on-axis diffracted radiation beams 696A, 696B, 696C, and 696D; the off-axis diffracted radiation beams 482B, 483A, 484B, and 485A; the off-axis diffracted radiation beams 583 and 585; the off-axis diffracted radiation beams 683A, 683B, 685A, 685B, 687A, 687B, 689A, and 689B; the reflected patterned radiation beam BE2; any diffracted radiation measured by the example metrology system 800; the diffracted radiation beams 985A, 985B, and 985C; the diffracted radiation beams 1086 and 1088; or any other suitable diffracted radiation beam (e.g., zero-order diffraction, +/−first-order diffraction, +/−second-order diffraction, and so forth). In some aspects, the measurement of the second diffracted radiation beam can be accomplished using suitable mechanical or other methods and include measuring the second diffracted radiation beam in accordance with any aspect or combination of aspects described with reference to FIGS. 1-10 above and FIG. 12 below.

At operation 1110, the method can include generating, by a controller (e.g., a detection system or subsystem, controller 566, example computing system 1200), an electronic signal based on the measured first diffracted radiation beam and the measured second diffracted radiation beam. In some aspects, the electronic signal can be indicative of measurement data for the region. In some aspects, the electronic signal can be indicative of an intensity difference (e.g., based on zero-order diffraction) between the first diffracted radiation beam and the second diffracted radiation beam. In some aspects, the electronic signal can be indicative of an intensity and/or phase difference (e.g., based on first-order diffraction) between the first diffracted radiation beam and the second diffracted radiation beam. In some aspects, the electronic signal can be indicative of an alignment of the region of the surface of the substrate. For example, the generating the electronic signal can include generating, by the controller, level data for the region based on the electronic signal. In another example, additionally or alternatively, the region can include a set of alignment marks and the generating the electronic signal can include generating, by the controller, alignment mark deformation data for the set of alignment marks based on the electronic signal. In some aspects, the generation of the electronic signal can be accomplished using suitable mechanical or other methods and include generating the electronic signal in accordance with any aspect or combination of aspects described with reference to FIGS. 1-10 above and FIG. 12 below.

In one illustrative and non-limiting example, the measuring the first diffracted radiation beam at operation 1104 can include measuring, by an on-axis detection system or subsystem, zero-order diffraction in response to the illuminating the region with the first radiation beam; the measuring the second diffracted radiation beam at operation 1108 can include measuring, by the on-axis detection system or subsystem, zero-order diffraction in response to the illuminating the region with the second radiation beam; and the generating the electronic signal at operation 1110 can include generating, by the controller, an intensity imbalance signal based on an intensity difference between the measured first diffracted radiation beam and the measured second diffracted radiation beam for use in determining level data and corrections based thereon. In another illustrative and non-limiting example, additionally or alternatively, the measuring the first diffracted radiation beam at operation 1104 can include measuring, by a first off-axis detection system or subsystem, first-order diffraction in response to the illuminating the region with the first radiation beam; the measuring the second diffracted radiation beam at operation 1108 can include measuring, by a second off-axis detection system or subsystem, first-order diffraction in response to the illuminating the region with the second radiation beam; and the generating the electronic signal at operation 1110 can include generating, by the controller, an alignment signal based on an intensity difference and/or phase difference between the measured first diffracted radiation beam and the measured second diffracted radiation beam for use in determining alignment data (e.g., asymmetry mark deformation data) and corrections based thereon.

Example Computing System

Aspects of the disclosure can be implemented in hardware, firmware, software, or any combination thereof. Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions, and combinations thereof can be described herein as performing certain actions. However, it should be appreciated that such descriptions are merely for convenience and that such actions in fact result from computing devices, processors, controllers, or other devices executing the firmware, software, routines, instructions, or combinations thereof and, in doing so, causing actuators or other devices (e.g., servo motors, robotic devices) to interact with the physical world.

Figure 12:
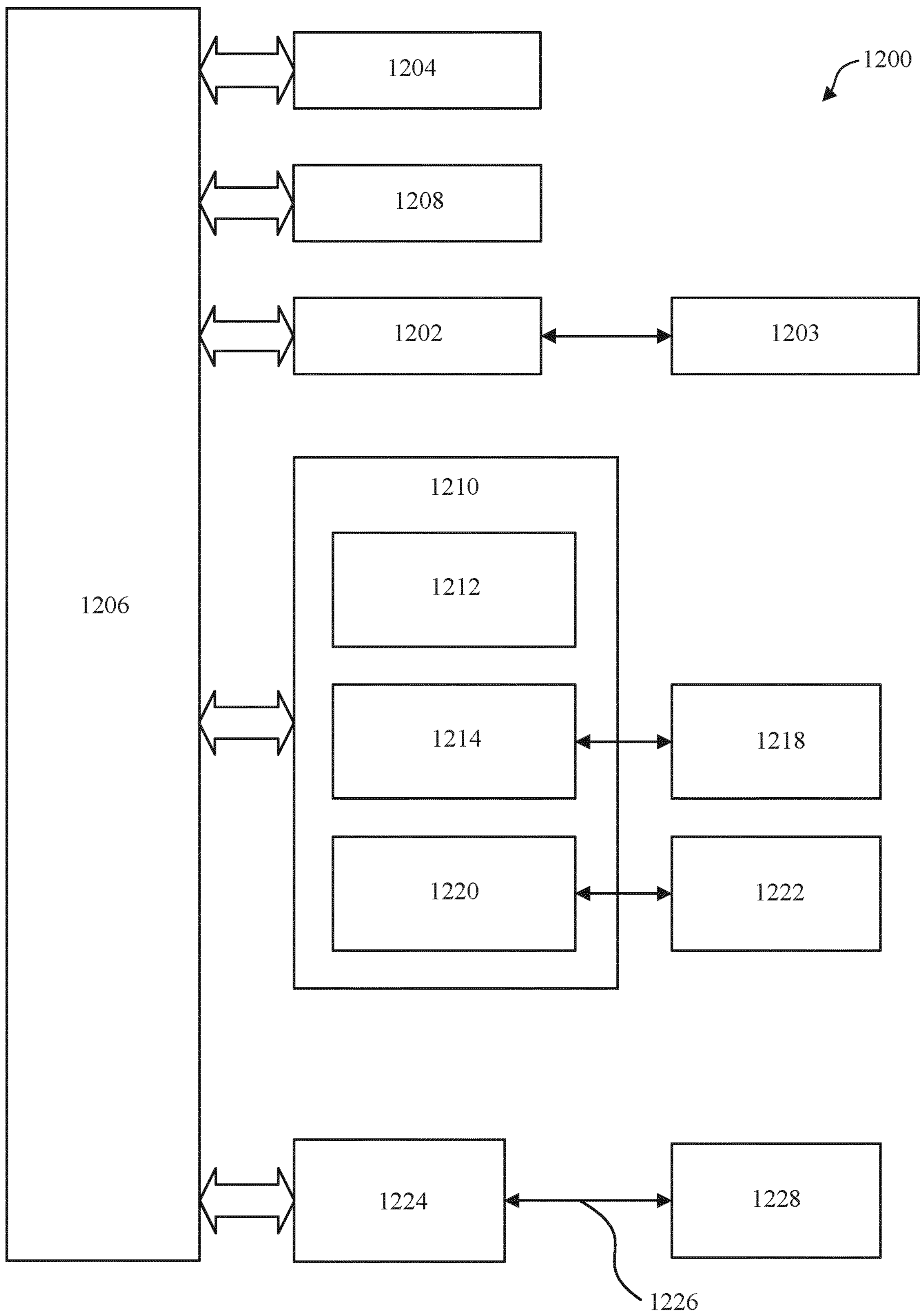
FIG. 12 is an example computer system for implementing some aspects of the present disclosure or portion(s) thereof.

Various aspects can be implemented, for example, using one or more computing systems, such as example computing system 1200 shown in FIG. 12. Example computing system 1200 can be a specialized computer capable of performing the functions described herein such as: the example metrology system 400 described with reference to FIG. 4; the example metrology system 500 described with reference to FIG. 5; the example metrology system 600 described with reference to FIGS. 6A, 6B, 6C, 6D, 6E, 6F, and 6G; the example metrology system 700 described with reference to FIG. 7; the example metrology system 800 described with reference to FIG. 8; the example metrology system 900 described with reference to FIG. 9; the example metrology system 1000 described with reference to FIG. 10; any other suitable system, sub-system, or component; or any combination thereof. Example computing system 1200 can include one or more processors (also called central processing units, or CPUs), such as a processor 1204. Processor 1204 is connected to a communication infrastructure 1206 (e.g., a bus). Example computing system 1200 can also include user input/output device(s) 1203, such as monitors, keyboards, pointing devices, etc., that communicate with communication infrastructure 1206 through user input/output interface(s) 1202. Example computing system 1200 can also include a main memory 1208 (e.g., one or more primary storage devices), such as random access memory (RAM). Main memory 1208 can include one or more levels of cache. Main memory 1208 has stored therein control logic (e.g., computer software) and/or data.

Example computing system 1200 can also include a secondary memory 1210 (e.g., one or more secondary storage devices). Secondary memory 1210 can include, for example, a hard disk drive 1212 and/or a removable storage drive 1214. Removable storage drive 1214 can be a floppy disk drive, a magnetic tape drive, a compact disk drive, an optical storage device, tape backup device, and/or any other storage device/drive.

Removable storage drive 1214 can interact with a removable storage unit 1218. Removable storage unit 1218 includes a computer usable or readable storage device having stored thereon computer software (control logic) and/or data. Removable storage unit 1218 can be a floppy disk, magnetic tape, compact disk, DVD, optical storage disk, and/or any other computer data storage device. Removable storage drive 1214 reads from and/or writes to removable storage unit 1218.

According to some aspects, secondary memory 1210 can include other means, instrumentalities or other approaches for allowing computer programs and/or other instructions and/or data to be accessed by example computing system 1200. Such means, instrumentalities or other approaches can include, for example, a removable storage unit 1222 and an interface 1220. Examples of the removable storage unit 1222 and the interface 1220 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Example computing system 1200 can further include a communications interface 1224 (e.g., one or more network interfaces). Communications interface 1224 enables example computing system 1200 to communicate and interact with any combination of remote devices, remote networks, remote entities, etc. (individually and collectively referred to as remote devices 1228). For example, communications interface 1224 can allow example computing system 1200 to communicate with remote devices 1228 over communications path 1226, which can be wired and/or wireless, and which can include any combination of LANs, WANs, the Internet, etc. Control logic, data, or both can be transmitted to and from example computing system 1200 via communications path 1226.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, example computing system 1200, main memory 1208, secondary memory 1210 and removable storage units 1218 and 1222, as well as tangible articles of manufacture embodying any combination of the foregoing. Such control logic, when executed by one or more data processing devices (such as example computing system 1200), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 12. In particular, aspects of the disclosure can operate with software, hardware, and/or operating system implementations other than those described herein.

The embodiments may further be described using the following clauses:

1. A metrology system, comprising:
   - a first illumination system configured to:
     - generate a first radiation beam at a first wavelength, and
     - transmit the first radiation beam toward a region of a surface of a substrate at a first incident angle;
   - a second illumination system configured to:
     - generate a second radiation beam at a second wavelength, and
     - transmit the second radiation beam toward the region at a second incident angle;
   - a first detection system configured to:
     - measure a first diffracted radiation beam at the first wavelength and diffracted from the region at a first diffraction angle in response to a first illumination of the region by the first radiation beam, and
     - generate a first measurement signal based on the first diffracted radiation beam;
   - a second detection system configured to:
     - measure a second diffracted radiation beam at the second wavelength and diffracted from the region at a second diffraction angle in response to a second illumination of the region by the second radiation beam, and
     - generate a second measurement signal based on the second diffracted radiation beam; and
   - a controller configured to:
     - generate an electronic signal based on the first measurement signal and the second measurement signal.
2. The metrology system of clause 1, wherein the second wavelength is equal to about the first wavelength.
3. The metrology system of clause 1, wherein the second wavelength is different from the first wavelength.
4. The metrology system of clause 1, wherein the second incident angle is equal to about the first incident angle.
5. The metrology system of clause 1, wherein the second incident angle is different from the first incident angle.
6. The metrology system of clause 1, wherein:
   - a first two-dimensional plane comprises the first radiation beam and the second radiation beam;
   - a second two-dimensional plane comprises the first diffracted radiation beam and the second diffracted radiation beam; and
   - a dihedral angle between the first two-dimensional plane and the second two-dimensional plane is non-zero.
7. The metrology system of clause 1, wherein an area of the region is about 1.0 square millimeter.
8. The metrology system of clause 1, wherein:
   - the first diffracted radiation beam is indicative of zero-order diffraction in response to the first illumination of the region by the first radiation beam; and
   - the second diffracted radiation beam is indicative of zero-order diffraction in response to the second illumination of the region by the second radiation beam.
9. The metrology system of clause 1, wherein:
   - the region comprises a set of alignment marks; and
   - the controller is further configured to generate alignment mark deformation data for the set of alignment marks based on the electronic signal.
10. The metrology system of clause 9, wherein the controller is further configured to generate the alignment mark deformation data based on an intensity difference between the first diffracted radiation beam and the second diffracted radiation beam.
11. The metrology system of clause 9, wherein:
    - the region comprises a portion of an alignment grating structure;
    - the portion of the alignment grating structure comprises the set of alignment marks; and the controller is further configured to determine an alignment position of the alignment grating structure based on the alignment mark deformation data.

12. The metrology system of clause 11, wherein the controller is further configured to correct the alignment position based on the alignment mark deformation data.

13. The metrology system of clause 1, wherein:
the metrology system comprises a coupler;
the coupler is configured to:
receive an incoherent radiation beam from an illumination source via an optical fiber;
transmit a first portion of the incoherent radiation beam to the first illumination system; and
transmit a second portion of the incoherent radiation beam to the second illumination system;
the first illumination system is configured to:
receive the first portion of the incoherent radiation beam; and
generate the first radiation beam based on the first portion of the incoherent radiation beam, wherein the first radiation beam is a first coherent radiation beam at the first wavelength; and
the second illumination system is configured to:
receive the second portion of the incoherent radiation beam; and
generate the second radiation beam based on the second portion of the incoherent radiation beam, wherein the second radiation beam is a second coherent radiation beam at the second wavelength.

14. The metrology system of clause 1, wherein:
the first illumination system comprises a first phase array;
the second illumination system comprises a second phase array;
the first phase array is configured to steer the first radiation beam toward the region at the first incident angle; and
the second phase array is configured to steer the second radiation beam toward the region at the second incident angle.

15. The metrology system of clause 13, wherein:
the first phase array comprises a first plurality of phase shifters; and
the second phase array comprises a second plurality of phase shifters.

16. The metrology system of clause 1, wherein:
the first illumination system comprises the second detection system; and
the second illumination system comprises the first detection system.

17. An integrated optical device, comprising:
a first illumination system configured to:
generate a first radiation beam at a first wavelength, and
transmit the first radiation beam toward a region of a surface of a substrate at a first incident angle;
a second illumination system configured to:
generate a second radiation beam at a second wavelength, and
transmit the second radiation beam toward the region at a second incident angle;
a first detection system configured to:
measure a first diffracted radiation beam at the first wavelength and diffracted from the region at a first diffraction angle in response to a first illumination of the region by the first radiation beam, and
generate a first measurement signal based on the first diffracted radiation beam;
a second detection system configured to:
measure a second diffracted radiation beam at the second wavelength and diffracted from the region at a second diffraction angle in response to a second illumination of the region by the second radiation beam, and
generate a second measurement signal based on the second diffracted radiation beam; and
a controller configured to:
generate an electronic signal based on the first measurement signal and the second measurement signal.

18. The integrated optical device of clause 17, wherein:
the region comprises a set of alignment marks; and
the controller is further configured to generate alignment mark deformation data for the set of alignment marks based on the electronic signal.

19. A method, comprising:
illuminating, by a first illumination system, a region of a surface of a substrate with a first radiation beam at a first incident angle;
illuminating, by a second illumination system, the region with a second radiation beam at a second incident angle;
measuring, by a first detection system, a first set of photons diffracted from the region in response to the illuminating the region with the first radiation beam;
measuring, by a second detection system, a second set of photons diffracted from the region in response to a second illumination of the region with the second radiation beam; and
generating, by a controller, an electronic signal based on the measured first set of photons and the measured second set of photons.

20. The method of clause 19, wherein:
the region comprises a set of alignment marks; and
the generating the alignment mark deformation data comprises generating, by the controller, alignment mark deformation data for the set of alignment marks based on the electronic signal.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms “wafer” or “die” herein may be considered as synonymous with the more general terms “substrate” or “target portion”, respectively. The substrate referred to herein can be processed, before or after exposure, in for example a track unit (a tool that applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A metrology system, comprising:
a first illumination system configured to:
generate a first radiation beam at a first wavelength, and
transmit the first radiation beam toward a region of a surface of a substrate at a first incident angle;
a second illumination system configured to:
generate a second radiation beam at a second wavelength, and
transmit the second radiation beam toward the region at a second incident angle;
a first detection system configured to:
measure a first diffracted radiation beam at the first wavelength and diffracted from the region at a first diffraction angle in response to a first illumination of the region by the first radiation beam, and
generate a first measurement signal based on the first diffracted radiation beam;
a second detection system configured to:
measure a second diffracted radiation beam at the second wavelength and diffracted from the region at a second diffraction angle in response to a second illumination of the region by the second radiation beam, and
generate a second measurement signal based on the second diffracted radiation beam;
a third detection system configured to:
measure a third diffracted radiation beam at the first wavelength and/or second wavelength and diffracted from the region at a third diffraction angle that is normal to the surface of the substrate, and
generate a third measurement signal based on the third diffracted radiation beam; and
a controller configured to generate an electronic signal based on the third measurement signal or on the first measurement signal and the second measurement signal.

2. The metrology system of claim 1, wherein the second wavelength is equal to about the first wavelength.

3. The metrology system of claim 1, wherein the second wavelength is different from the first wavelength.

4. The metrology system of claim 1, wherein the second incident angle is about equal to the first incident angle.

5. The metrology system of claim 1, wherein the second incident angle is different from the first incident angle.

6. The metrology system of claim 1, wherein:
a first two-dimensional plane comprises the first radiation beam and the second radiation beam;
a second two-dimensional plane comprises the first diffracted radiation beam and the second diffracted radiation beam; and
a dihedral angle between the first two-dimensional plane and the second two-dimensional plane is non-zero.

7. The metrology system of claim 1, wherein an area of the region is about 1.0 square millimeter.

8. The metrology system of claim 1, wherein:
the first diffracted radiation beam is indicative of zero-order diffraction in response to the first illumination of the region by the first radiation beam; and
the second diffracted radiation beam is indicative of zero-order diffraction in response to the second illumination of the region by the second radiation beam.

9. The metrology system of claim 1, wherein:
the region comprises a set of alignment marks; and
the controller is further configured to generate alignment mark deformation data for the set of alignment marks based on the electronic signal.

10. The metrology system of claim 9, wherein the controller is further configured to generate the alignment mark deformation data based on an intensity difference between the first diffracted radiation beam and the second diffracted radiation beam.

11. The metrology system of claim 9, wherein:
the region comprises a portion of an alignment grating structure;
the portion of the alignment grating structure comprises the set of alignment marks; and
the controller is further configured to determine an alignment position of the alignment grating structure based on the alignment mark deformation data.

12. The metrology system of claim 11, wherein the controller is further configured to correct the alignment position based on the alignment mark deformation data.

13. The metrology system of claim 1, wherein:
the metrology system comprises a coupler;
the coupler is configured to:
receive an incoherent radiation beam from an illumination source via an optical fiber;

transmit a first portion of the incoherent radiation beam to the first illumination system; and transmit a second portion of the incoherent radiation beam to the second illumination system;

the first illumination system is configured to:

receive the first portion of the incoherent radiation beam; and generate the first radiation beam based on the first portion of the incoherent radiation beam, wherein the first radiation beam is a first coherent radiation beam at the first wavelength; and the second illumination system is configured to:

receive the second portion of the incoherent radiation beam; and generate the second radiation beam based on the second portion of the incoherent radiation beam, wherein the second radiation beam is a second coherent radiation beam at the second wavelength.

14. The metrology system of claim 1, wherein:

the first illumination system comprises a first phase array;

the second illumination system comprises a second phase array;

the first phase array is configured to steer the first radiation beam toward the region at the first incident angle; and the second phase array is configured to steer the second radiation beam toward the region at the second incident angle.

15. The metrology system of claim 14, wherein:

the first phase array comprises a first plurality of phase shifters; and the second phase array comprises a second plurality of phase shifters.

16. The metrology system of claim 1, wherein:

the first illumination system comprises the second detection system; and the second illumination system comprises the first detection system.

17. An integrated optical device, comprising:

a first illumination system configured to:

generate a first radiation beam at a first wavelength, and transmit the first radiation beam toward a region of a surface of a substrate at a first incident angle;

a second illumination system configured to:

generate a second radiation beam at a second wavelength, and transmit the second radiation beam toward the region at a second incident angle;

a first detection system configured to:

measure a first diffracted radiation beam at the first wavelength and diffracted from the region at a first diffraction angle in response to a first illumination of the region by the first radiation beam, and generate a first measurement signal based on the first diffracted radiation beam;

a second detection system configured to:

measure a second diffracted radiation beam at the second wavelength and diffracted from the region at a second diffraction angle in response to a second illumination of the region by the second radiation beam, and generate a second measurement signal based on the second diffracted radiation beam;

a third detection system configured to:

measure a third diffracted radiation beam at the first wavelength and/or second wavelength and diffracted from the region at a third diffraction angle that is normal to the surface of the substrate, and generate a third measurement signal based on the third diffracted radiation beam; and a controller configured to generate an electronic signal based on the third measurement signal or on the first measurement signal and the second measurement signal.

18. The integrated optical device of claim 17, wherein:

the region comprises a set of alignment marks; and the controller is further configured to generate alignment mark deformation data for the set of alignment marks based on the electronic signal.

19. The metrology system of claim 1, wherein the third diffracted radiation beam is indicative of first-order diffraction in response to the first illumination of the region by the first radiation beam and/or first-order diffraction in response to the second illumination of the region by the second radiation beam.

* * * * *